United States Patent
Celaya et al.

(10) Patent No.: US 9,899,349 B2
(45) Date of Patent: Feb. 20, 2018

(54) SEMICONDUCTOR PACKAGES AND RELATED METHODS

(71) Applicant: SEMICONDUCTOR COMPONENTS INDUSTRIES, LLC, Phoenix, AZ (US)

(72) Inventors: Phillip Celaya, Gilbert, AZ (US); James P Letterman, Jr., Mesa, AZ (US); Robert L. Marquis, Greene, RI (US); Darrell Truhitte, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/063,011

(22) Filed: Mar. 7, 2016

(65) Prior Publication Data

US 2016/0190095 A1    Jun. 30, 2016

Related U.S. Application Data

(60) Continuation-in-part of application No. 14/168,850, filed on Jan. 30, 2014, now abandoned, which is a
(Continued)

(51) Int. Cl.
*H01L 21/48* (2006.01)
*H01L 23/00* (2006.01)
(Continued)

(52) U.S. Cl.
CPC ........ *H01L 24/97* (2013.01); *H01L 21/02021* (2013.01); *H01L 21/4821* (2013.01);
(Continued)

(58) Field of Classification Search
CPC ........ H01L 23/495; H01L 21/78–21/86; H01L 23/49541; H01L 21/02021; H01L 21/4842
(Continued)

(56) References Cited

U.S. PATENT DOCUMENTS

| 5,327,008 A | 7/1994 | Djennas et al. |
| 5,866,939 A * | 2/1999 | Shin ............... H01L 23/3114 257/666 |

(Continued)

FOREIGN PATENT DOCUMENTS

WO    2003103038    12/2003

OTHER PUBLICATIONS

Vibratory Plating Units Combining rack plating quality with barrel plating production at significant savings, Bulletin 901, Technic Inc, Equipment Division, www.technic,com , Downloaded Jan. 15, 2014.
(Continued)

*Primary Examiner* — Kimberly Rizkallah
*Assistant Examiner* — Maria Ligai
(74) *Attorney, Agent, or Firm* — Robert D. Atkins; Patent Law Group: Atkins and Associates, P.C.

(57) ABSTRACT

Methods of forming a semiconductor package. Implementations include providing a leadframe, coupling a semiconductor die or an electronic component to the leadframe, and encapsulating at least a portion of the semiconductor die or the electronic component using a mold compound leaving two or more leads of the leadframe exposed. The method may also include coating the two or more leads of the leadframe with an electrically conductive layer. The method may include fully electrically and physically singulating one or more tie bars between two or more leads of the leadframe, a lead of the two or more leads and a leadframe flag or any combination thereof. The method may also include singu-
(Continued)

lating the leadframe to form one or more semiconductor packages.

15 Claims, 34 Drawing Sheets

Related U.S. Application Data continuation-in-part of application No. 13/692,514, filed on Dec. 3, 2012, now abandoned, which is a continuation of application No. 13/190,922, filed on Jul. 26, 2011, now Pat. No. 8,324,026, which is a division of application No. 12/362,142, filed on Jan. 29, 2009, now Pat. No. 8,071,427.

(51) Int. Cl.
| | |
|---|---|
| H01L 21/56 | (2006.01) |
| H01L 21/78 | (2006.01) |
| H01L 23/495 | (2006.01) |
| H01L 21/02 | (2006.01) |
| H01L 23/31 | (2006.01) |

(52) U.S. Cl.
CPC ............ *H01L 21/561* (2013.01); *H01L 21/78* (2013.01); *H01L 23/49541* (2013.01); *H01L 23/49548* (2013.01); *H01L 23/49582* (2013.01); *H01L 21/4828* (2013.01); *H01L 23/3107* (2013.01); *H01L 23/4952* (2013.01); *H01L 24/05* (2013.01); *H01L 24/32* (2013.01); *H01L 24/48* (2013.01); *H01L 24/49* (2013.01); *H01L 24/73* (2013.01); *H01L 2224/0401* (2013.01); *H01L 2224/05553* (2013.01); *H01L 2224/16245* (2013.01); *H01L 2224/32245* (2013.01); *H01L 2224/48091* (2013.01); *H01L 2224/48247* (2013.01); *H01L 2224/49171* (2013.01); *H01L 2224/73265* (2013.01); *H01L 2224/97* (2013.01); *H01L 2924/00014* (2013.01); *H01L 2924/10161* (2013.01); *H01L 2924/19107* (2013.01)

(58) Field of Classification Search
USPC .................................. 438/462, 465; 257/670
See application file for complete search history.

(56) References Cited

U.S. PATENT DOCUMENTS

| | | | |
|---|---|---|---|
| 5,900,676 A | 5/1999 | Kweon et al. | |
| 5,969,411 A | 10/1999 | Fukaya | |
| 5,976,912 A | 11/1999 | Fukutomi et al. | |
| 6,001,671 A | 12/1999 | Fjelstad | |
| 6,130,473 A | 10/2000 | Mostafazadeh et al. | |
| 6,143,981 A | 11/2000 | Glenn | |
| 6,193,858 B1 | 2/2001 | Hradil | |
| 6,229,200 B1 | 5/2001 | McLellan et al. | |
| 6,242,281 B1 | 6/2001 | McLellan et al. | |
| 6,255,740 B1 | 7/2001 | Tsuji et al. | |
| 6,294,100 B1 | 9/2001 | Fan et al. | |
| 6,338,984 B2 | 1/2002 | Minamio et al. | |
| 6,498,099 B1 | 12/2002 | McLellan et al. | |
| 6,545,347 B2 | 4/2003 | McClellan | |
| 6,585,905 B1 | 7/2003 | Fan et al. | |
| 6,593,643 B1 | 7/2003 | Seki et al. | |
| 6,608,366 B1 | 8/2003 | Fogelson et al. | |
| 6,638,790 B2 | 10/2003 | Minamio et al. | |
| 6,664,136 B2 | 12/2003 | Motonami et al. | |
| 6,734,044 B1 | 5/2004 | Fan et al. | |
| 6,841,414 B1 | 1/2005 | Hu et al. | |
| 6,872,599 B1 | 3/2005 | Li et al. | |
| 6,940,154 B2 | 9/2005 | Pedron et al. | |
| 7,071,545 B1 | 7/2006 | Patel et al. | |
| 7,091,581 B1 | 8/2006 | McLellan et al. | |
| 7,183,630 B1 | 2/2007 | Fogelson et al. | |
| 7,247,526 B1 | 7/2007 | Fan et al. | |
| 7,262,491 B2 | 8/2007 | Islam et al. | |
| 7,443,043 B2 | 10/2008 | Sakamoto | |
| 7,635,910 B2 | 12/2009 | Sinaga et al. | |
| 7,846,774 B2 | 12/2010 | Yee et al. | |
| 7,875,963 B1 | 1/2011 | Kim et al. | |
| 8,089,166 B2 | 1/2012 | Kim | |
| 8,318,340 B2 | 11/2012 | Stimits | |
| 8,444,840 B2 | 5/2013 | Stimits et al. | |
| 8,648,474 B2 | 2/2014 | Nondhasittichai et al. | |
| 2002/0067486 A1 | 6/2002 | S. Forney et al. | |
| 2002/0144396 A1 | 10/2002 | Glenn | |
| 2004/0142505 A1 | 7/2004 | Huang et al. | |
| 2005/0003586 A1* | 1/2005 | Shimanuki | H01L 21/4832 438/124 |
| 2005/0093117 A1 | 5/2005 | Masuda et al. | |
| 2005/0116321 A1* | 6/2005 | Li | H01L 23/3107 257/666 |
| 2005/0206010 A1 | 9/2005 | Noquil et al. | |
| 2007/0126092 A1* | 6/2007 | San Antonio | H01L 21/561 257/674 |
| 2007/0176267 A1 | 8/2007 | Abbott | |
| 2008/0001263 A1 | 1/2008 | Dimaano et al. | |
| 2008/0226976 A1 | 9/2008 | Stimits | |
| 2008/0258273 A1* | 10/2008 | Liang | H01L 21/4832 257/666 |
| 2008/0290484 A1 | 11/2008 | Low et al. | |
| 2009/0160037 A1* | 6/2009 | Bayan | H01L 23/3185 257/666 |
| 2009/0289335 A1 | 11/2009 | Camacho et al. | |
| 2011/0244629 A1 | 10/2011 | Gong et al. | |
| 2012/0043660 A1 | 2/2012 | Poddar et al. | |
| 2016/0056097 A1 | 2/2016 | Bai et al. | |
| 2016/0254217 A1 | 9/2016 | Lu et al. | |

OTHER PUBLICATIONS

"Soldering the QFN Stacked Die Sensors to a PC Board," by Thomas Koschmieder, Cheol Han, Kimberly Tuck, and John Dixon, Freescale Semiconductor Application Note AN 3111, Rev 5, Apr. 2010, 9 Pages.

* cited by examiner

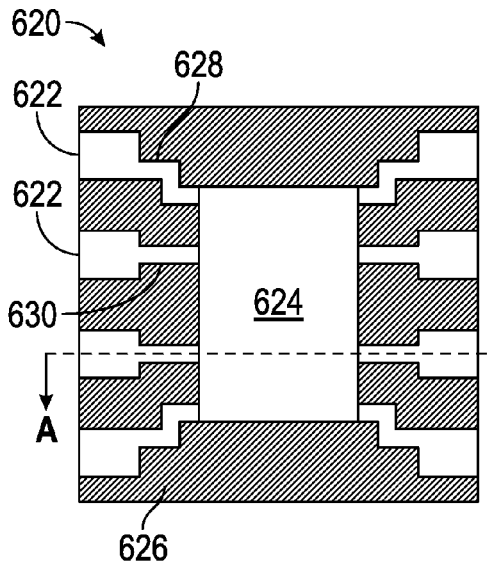
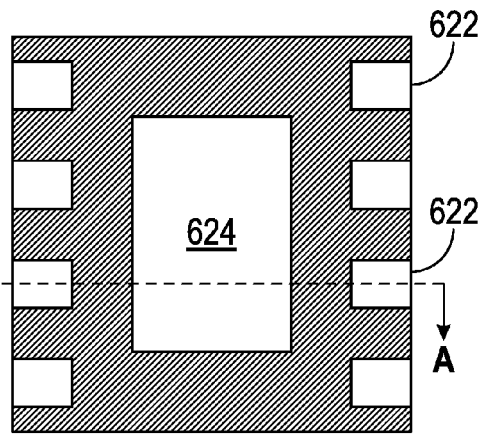
FIG. 45A                    FIG. 46A
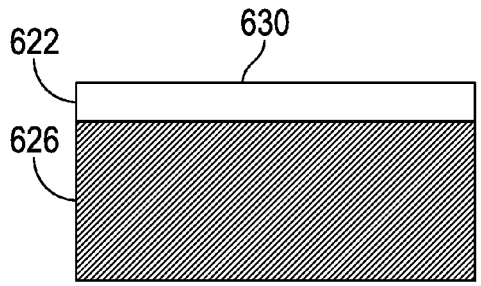
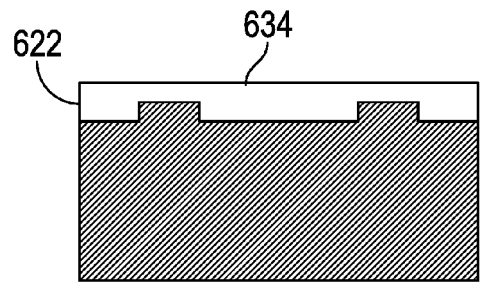
FIG. 45B                    FIG. 46B
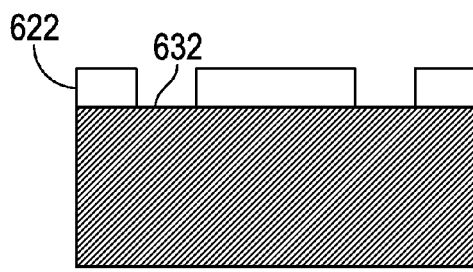
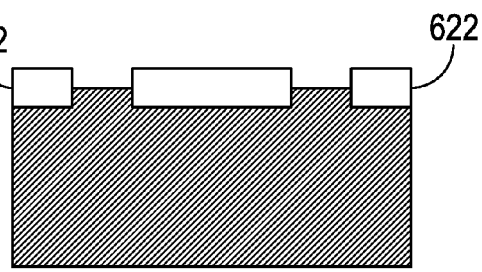
FIG. 45C                    FIG. 46C

SEMICONDUCTOR PACKAGES AND RELATED METHODS

CROSS REFERENCE TO RELATED APPLICATIONS

This application is a continuation-in-part application of the earlier U.S. Utility patent application to Letterman, et al. entitled "Method For Manufacturing A Semiconductor Component And Structure," application Ser. No. 14/168,850, filed Jan. 30, 2014, now pending; which is a continuation-in-part of prior U.S. patent application Ser. No. 13/692,514, filed on Dec. 3, 2012, to Celaya et al., entitled "Method For Manufacturing A Semiconductor Component And Structure Therefor," now abandoned; which is a continuation of prior U.S. patent application Ser. No. 13/190,922, filed on Jul. 26, 2011, now U.S. Pat. No. 8,324,026, to Celaya et al., entitled "Method For Manufacturing A Semiconductor Component;" which is a divisional application of U.S. patent application Ser. No. 12/362,142, filed on Jan. 29, 2009, now U.S. Pat. No. 8,071,427 to Celaya et al., entitled "Method for Manufacturing a Semiconductor Component and Structure Therefor"; the disclosures of each which are hereby incorporated entirely herein by reference.

BACKGROUND

1. Technical Field

Aspects of this document relate generally to semiconductor packages, such as for semiconductor die and other electronic components.

2. Background

Semiconductor packages use leadframes to support a die or other electronic component. Various leadframe designs exist that form physical and electrical connections between the semiconductor package and a circuit board to which the package is mounted. The die or other electronic component attached to the leadframe is most often fully or partially encapsulated using a mold compound for protection from humidity and other environmental conditions.

SUMMARY

Implementations of a method of forming a semiconductor package may include: providing a leadframe, coupling a semiconductor die or an electronic component to the leadframe, and encapsulating at least a portion of the semiconductor die or the electronic component using a mold compound leaving two or more leads of the leadframe exposed. The method may also include coating the two or more leads of the leadframe with an electrically conductive layer. The method may include fully electrically and physically singulating one or more tie bars between two or more leads of the leadframe, a lead of the two or more leads and a leadframe flag, or any combination thereof. The method may also include singulating the leadframe to form one or more semiconductor packages.

Implementations of the method of forming a semiconductor package may include one, all, or any of the following:

The method may further include fully electrically and physically singulating two or more of the two or more leads of the leadframe.

The method may further include partially physically singulating the one or more tie bars between the two or more leads of the leadframe, the lead of the two or more leads and the leadframe flag, or any combination thereof, prior to coating the two or more leads of the leadframe with an electrically conductive layer.

The method may further include bending one or more edges of the leadframe prior to fully electrically and physically singulating the one or more tie bars.

Bending one or more edges of the leadframe may further include deflecting the one or more edges of the leadframe to form a simple bend or formed bending the one or more edges of the leadframe to form a stepped bend.

The leadframe may include one or more half etched portions.

The one or more tie bars are arranged relative to the leadframe flag and the one or more leads of the leadframe so that the one or more tie bars cannot be singulated using a saw process or a high pressure water jet process.

Fully electrically and physically singulating one or more tie bars may further include singulating using a laser cutting process or a masking and etching cutting process.

A distance between the one or more leads of the leadframe and the one or more tie bars may be a single predetermined width.

Implementations of a method of processing an encapsulated leadframe may include: coating two more leads of an encapsulated leadframe with an electrically conductive layer and fully electrically and physically singulating one or more tie bars between two or more leads of the encapsulated leadframe, a lead of the two or more leads and a leadframe flag, or any combination thereof. The method may also include singulating the encapsulated leadframe to form one or more semiconductor packages.

Implementations of the method of processing an encapsulated leadframe may include one, all, or any of the following:

The method may further include fully electrically and physically singulating two or more of the two or more leads of the leadframe.

The method may further include partially physically singulating the one or more tie bars between the two or more leads of the encapsulated leadframe, the lead of the two or more leads and the leadframe flag, or any combination thereof, prior to coating the two or more leads of the encapsulated leadframe with an electrically conductive layer.

The method may further include bending one or more edges of the encapsulated leadframe prior to fully electrically and physically singulating the one or more tie bars.

Bending one or more edges of the encapsulated leadframe may further include deflecting the one or more edges of the encapsulated leadframe to form a simple bend or formed bending of the one or more edges of the encapsulated leadframe to form a stepped bend.

The encapsulated leadframe may include one or more half etched portions.

The one or more tie bars may be arranged relative to the leadframe flag and the one or more leads of the encapsulated leadframe so that the one or more tie bars cannot be singulated using a saw process or a high pressure water jet process.

Fully electrically and physically singulating one or more tie bars may further include singulating using a laser cutting process or a masking and etching cutting process.

A distance between the one or more leads of the encapsulated leadframe and the one or more tie bars may be a single predetermined width.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIG. 45A is a top view of a semiconductor package showing a full thickness leadframe;

FIG. 45B is a cross-sectional view of the semiconductor package of FIG. 45A taken along the sectional line A-A;

FIG. 45C is a cross-sectional view of the semiconductor package of FIG. 45B following singulation;

FIG. 46A is a top view of the semiconductor package of FIG. 45A showing the fully singulated leadframe;

FIG. 46B is a cross-sectional view of a half etched the semiconductor package;

FIG. 46C is a cross-sectional view of the semiconductor package of FIG. 46B following singulation;

DESCRIPTION

This disclosure, its aspects and implementations, are not limited to the specific components, assembly procedures or method elements disclosed herein. Many additional components, assembly procedures and/or method elements known in the art consistent with the intended semiconductor packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages and related methods, and implementing components and methods, consistent with the intended operation and methods.

Figure 1:
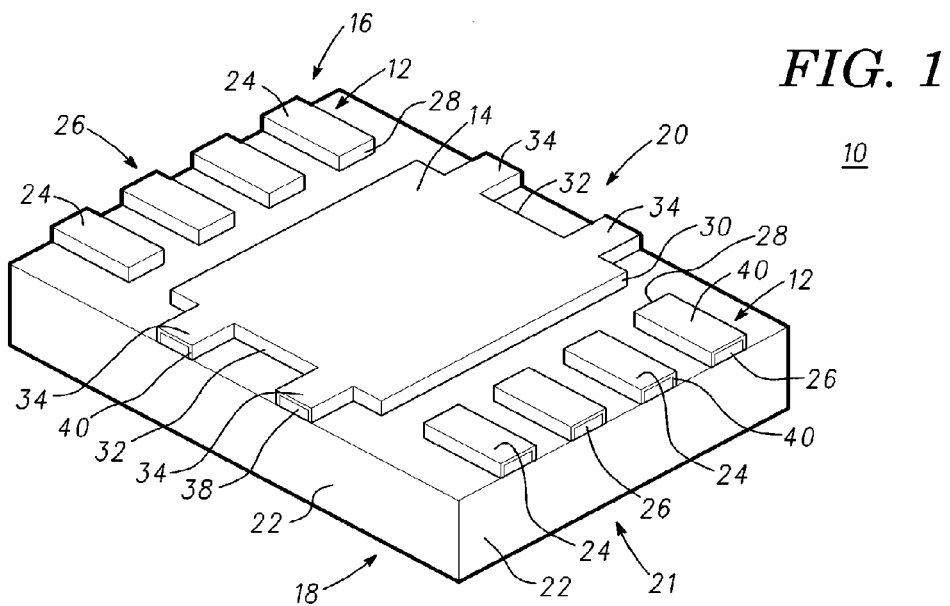
FIG. 1 is an isometric view of a first implementation of a semiconductor component during manufacture.

FIG. 1 is an isometric view of an implementation semiconductor component 10 during manufacture. What is shown in FIG. 1 are leadframe leads 12 and a leadframe flag 14 of a leadframe 16 partially embedded in a mold compound 18, which has sides 20 and 21 and edges or side surfaces 22. Leadframe leads 12 and leadframe flag 14 protrude or extend from side 20. In particular implementations, lead frame 16 is made of copper. Other suitable materials for leadframe 16 include, by non-limiting example, copper alloys, steel, iron, or the like. Leadframe leads 12 are shown as being rectangular cuboids having side surfaces 24 and end surfaces 26 and 28. Leadframe flag 14 is a rectangular cuboid having side surfaces 30, end surfaces 32, and extensions 34 extending from end surfaces 32. The shapes of the leadframe flag and leadframe leads are not limited to having a rectangular cuboid shape. Other shapes for the leadframe flag and leadframe leads include circular, oval, square, triangular, pentagonal, or any other geometric shape. Extensions 34 have end surfaces 38. A layer of electrically conductive material 40 is formed over leadframe leads 12 and flag 14. Electrically conductive material 40 may be tin, lead, solder, a combination of tin and lead, or the like. Electrically conductive material 40 is absent from end surfaces 26 of leadframe leads 12 and end surfaces 38 of extensions 34. Thus, end surfaces 26 and 38 are exposed regions of leadframe leads 12. When leadframe 16 is copper, end surfaces 26 and 38 are exposed regions of copper. By way of example, end surfaces 26 and 38 are exposed when semiconductor components 10 are separated or singulated from a leadframe strip (not shown) and may be referred to as outer edges of the leadframe lead.

Figure 2:
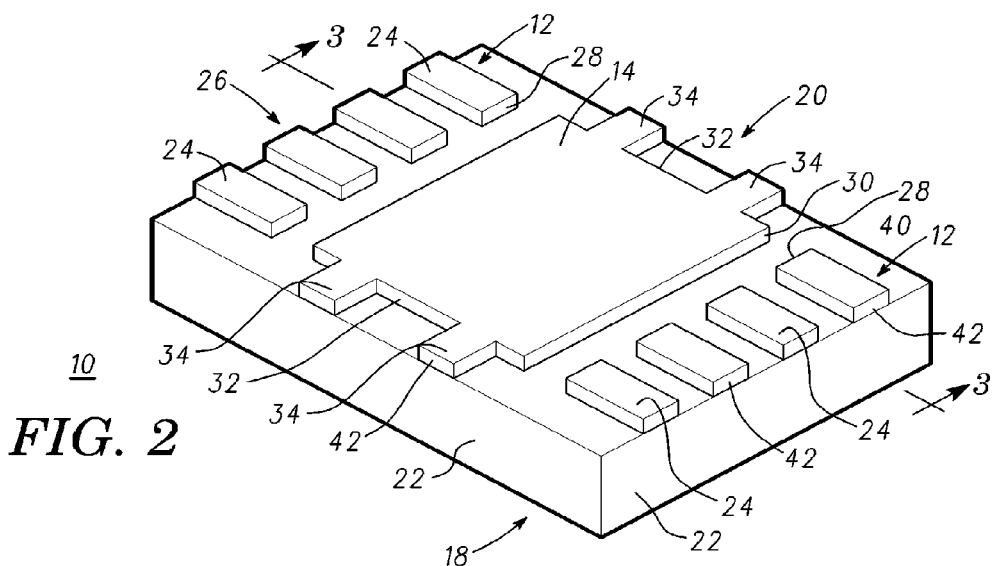
FIG. 2 is an isometric view the semiconductor component of FIG. 1 at a later stage of manufacture.

Referring now to FIG. 2, an electrically conductive material 42 is formed on electrically conductive layer 40 and on end surfaces 26 and 38 using, for example, an electroplating process such as a spouted bed electroplating process or a vibratory plating process. The spouted bed electroplating process may be performed in a spouted bed electroplating device and the vibratory plating process may be performed in a vibratory plating device. Electrically conductive material 42 may be referred to as vibratory plated material or the spouted bed electroplated material when formed using a vibratory plating device or a spouted bed electroplating device, respectively, and may be formed over more than fifty percent and up to one hundred percent of the outer edge of the least one of the plurality of leads. Layers 40 and 42 are further illustrated in FIG. 3. In various implementations, the material of electrically conductive layer 42 is tin. Other suitable materials for electrically conductive layer 42 include, by non-limiting example, lead; solder; a combination of tin and lead; silver; nickel; a combination of nickel, lead, and gold; or the like. Similarly, other methods for forming electrically conductive layer 42 may be used in various implementations. Layer of electrically conductive material 42 may cover or partially cover surfaces 26 and 38. An advantage of forming layers of electrically conductive material 42 is that it may form a wettable material over surfaces 26 and 38.

Figure 3:
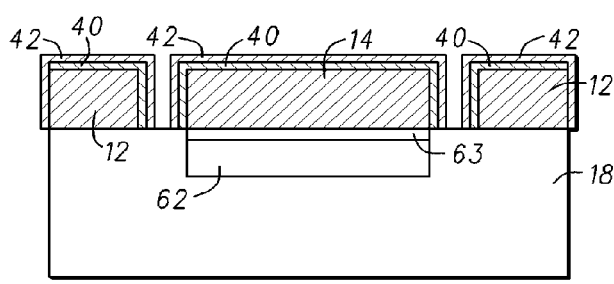
FIG. 3 is a cross-sectional view of the semiconductor component of FIG. 2 taken along section line 3-3 of FIG. 2.

FIG. 3 is a cross-sectional view of semiconductor component 10 taken along section line 3-3 of FIG. 2. FIG. 3 further illustrates leadframe leads 12, flag 14, and electrically conductive layers 40 and 42. For the sake of completeness, a semiconductor chip 62 is shown as being mounted to leadframe flag 14 through a die attach material 63.

Figure 4:
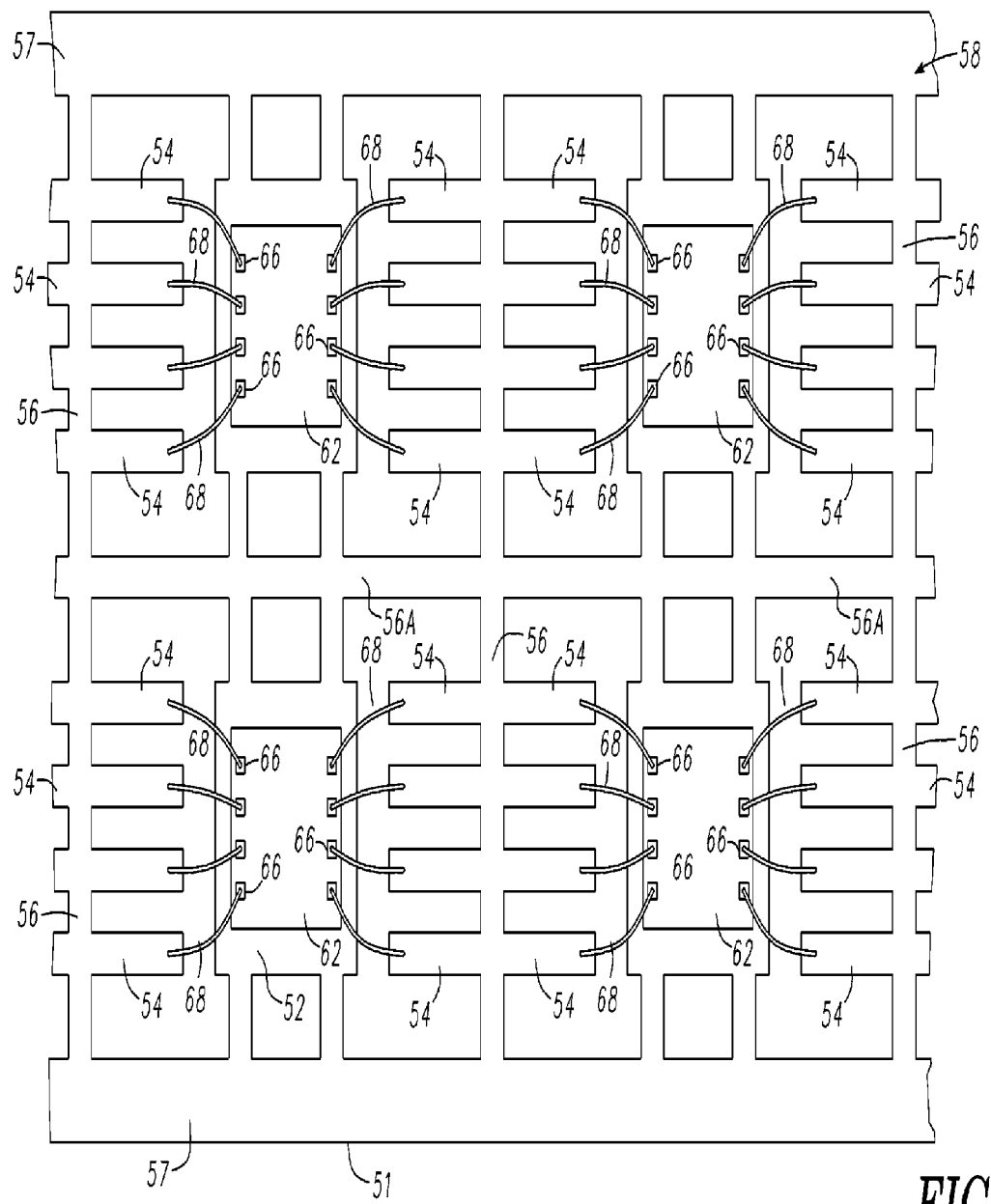
FIG. 4 is a top view of a plurality of a second implementation of semiconductor components.
Figure 5:
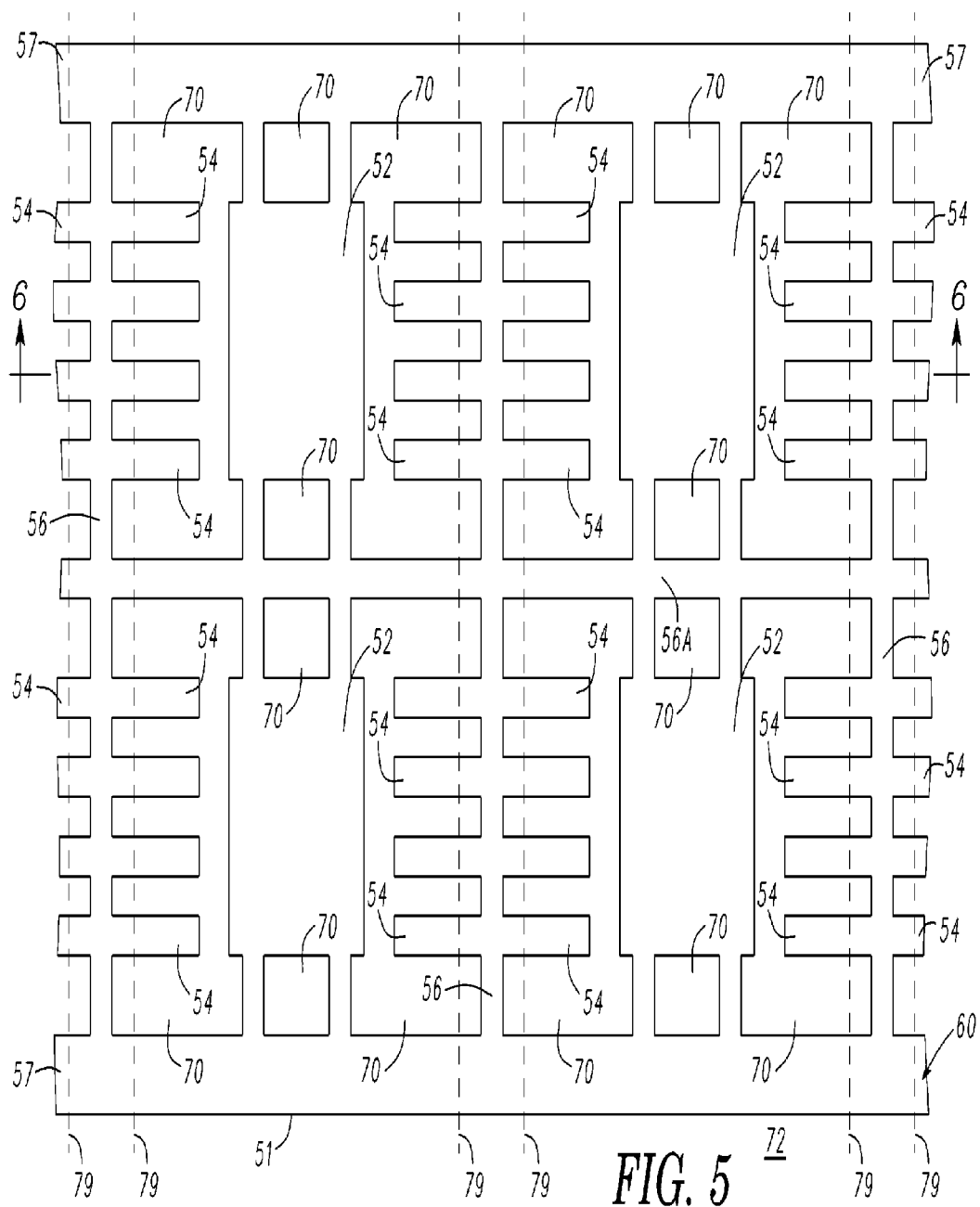
FIG. 5 is a bottom view of the plurality of semiconductor components of FIG. 4 at a later stage of manufacture.
Figure 9:
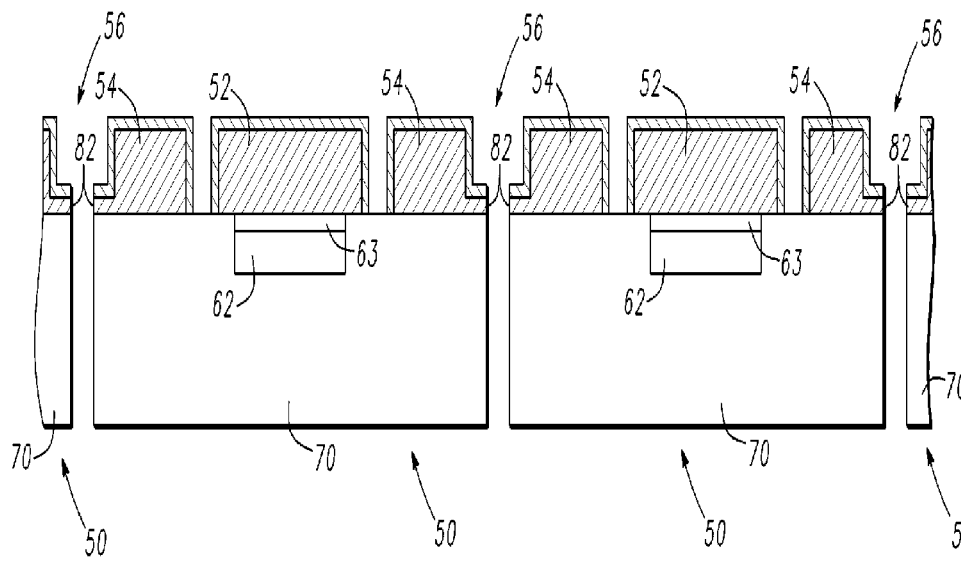
FIG. 9 is a side view of the plurality of semiconductor components of FIG. 8 at a later stage of manufacture.

FIG. 4 is a top view of a portion of an electrically conductive support 51 having device or component receiving areas 52, interconnect structures 54, structural support members 56, 56A, and 57, and opposing sides 58 and 60 (opposing side 60 is illustrated in FIG. 5) used in the manufacture of semiconductor components 50 (shown in FIG. 9). Interconnect structures 54 are also referred to as electrical interconnect structures or electrically conductive interconnect structures. It should be noted that the term top view is used for the sake of clarity and to distinguish the side of electrically conductive support 51 to which one or more active circuit elements or one or more passive circuit elements is mounted. In various implementations, electrically conductive support 51 is a leadframe, interconnect structures 52 are flags, interconnect structures 54 are leadframe leads, support members 56 and 56A are tie bars, and support members 57 are rails. By way of example, semiconductor chips or dice/die 62 are coupled to side 58 of leadframe 51 through a die attach material 63 (shown in FIG. 6). More particularly, a semiconductor chip 62 is mounted to each flag 52 through the die attach material. Semiconductor chips 62 have bond pads 66 that are coupled to corresponding leadframe leads 54 through bond wires 68. Bond wires are also referred to as wirebonds. Many numbers of and arrangements of flags and leadframe leads and their shapes may be used in various implementations. Although semiconductor chips 62 have been described as being mounted to flags 52, passive circuit elements such as resistors, inductors, and capacitors as well as active circuit elements such as semiconductor chips comprising transistors may be coupled to or mounted on leadframe 51 in place of or in addition to semiconductor chips 62 in various implementations.

Referring now to FIG. 5, a bottom view of a portion of leadframe 51 after a mold compound 70 has been formed over semiconductor chips 62 and wirebonds 68 to form a molded leadframe strip 72 is shown. It should be understood that mold compound 70 is formed over side 58, i.e., the top side, leaving side 60 substantially free of mold compound and that FIG. 5 is a bottom view of leadframe 51. It should be further understood that referring to the views shown in the figures as top views and bottom views and the designation of a view as being a top view or a bottom view is merely to facilitate describing various implementations. Broken lines 79 indicate where portions of leadframe leads 54 will be separated and exposed. Broken lines 79 also indicate the regions in which tie bars 56 are removed. Separating and exposing leadframe leads 54 and removing tie bars 56 are further described with reference to FIG. 7.

Figure 6:
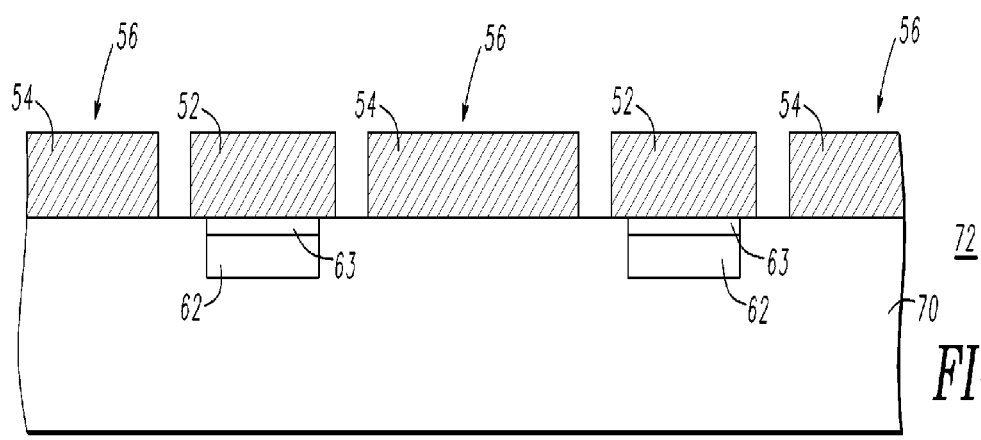
FIG. 6 is a cross-sectional view of the plurality of semiconductor components of FIG. 5 taken along section line 6-6 at a later stage of manufacture.

FIG. 6 is a cross-sectional view of molded leadframe strip 72 taken along section line 6-6 of FIG. 5. FIG. 6 illustrates portions of leadframe flags 52, leadframe leads 54, die attach material 63, and semiconductor chips 62.

Figure 7:
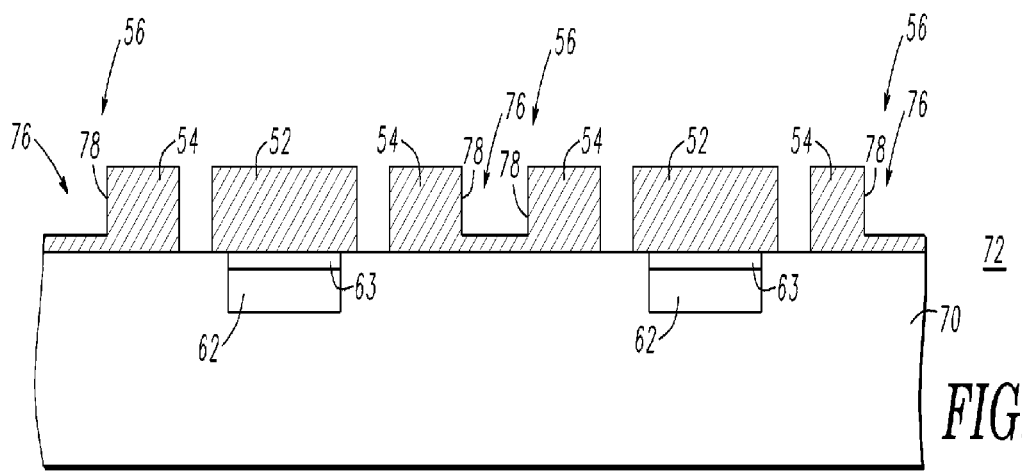
FIG. 7 is a cross-sectional view of the plurality of semiconductor components of FIG. 6 at a later stage of manufacture.

FIG. 7 is a cross-sectional view of molded leadframe strip 72 shown in FIG. 6 at a later stage of manufacture. What is shown in FIG. 7 is leadframe 51 after portions have been removed. More particularly, portions of leadframe leads 54 and tie bars 56 are removed to form cavities 76 having sidewalls 78. By way of example, the portions of leadframe leads 54 and tie bars 56 are removed by partially sawing into leadframe leads 54 and tie bars 56. Preferably, the thickness of leadframe leads 54 and tie bars 56 that are removed ranges from about 50 percent (%) to 100% of the thicknesses of leadframe leads 54 and tie bars 56. However, the thicknesses of leadframe leads 54 and tie bars 56 that are removed may be less than 50% and equal to or greater than 100% of their thicknesses. In particular implementations, about three-fourths of the thickness of leadframe leads 54 and tie bars 56 is removed. Suitable techniques for removing the portions of leadframe leads 54 include sawing, cutting, etching, stamping, punching, or the like. The regions at which the portions of leadframe leads 54 and tie bars 56 are removed are shown in FIG. 5 and identified by broken lines 79.

Figure 8:
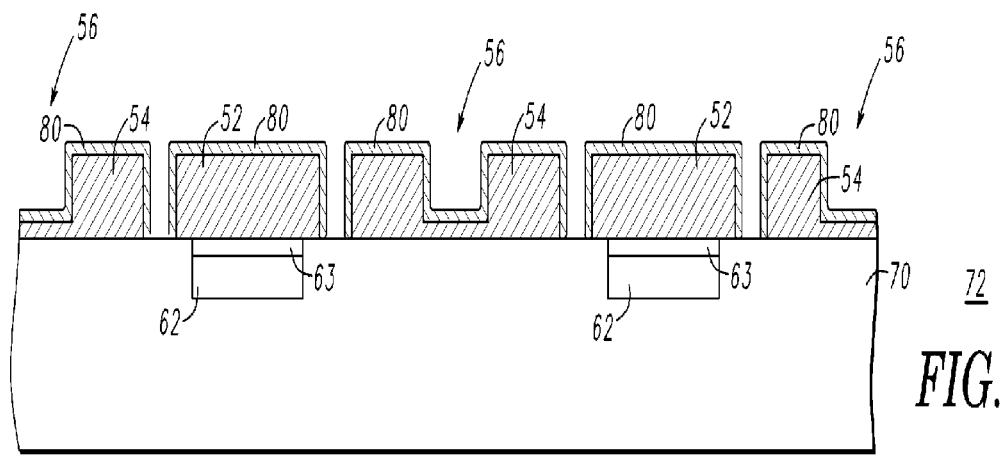
FIG. 8 is a cross-sectional view of the plurality of semiconductor components of FIG. 7 at a later stage of manufacture.

Referring now to FIG. 8, a layer of electrically conductive material 80 having a thickness ranging from about 0.5 microinches (12.7 nanometers) to about 3,000 microinches (76.2 micrometers) is formed on leadframe leads 54, including the portions of leadframe leads 54 within cavities 76. In various implementations, electrically conductive material 80 is tin formed by an electroplating process using a spouted bed electroplating device or a vibratory plating device. Electrically conductive material 80 may be referred to as vibratory plated material or the spouted bed electroplated material when formed using a vibratory plating device or a spouted bed electroplating device, respectively, and may be formed over more than fifty percent and up to one hundred percent of an outer edge of the least one of the leadframe leads. The type of electrically conductive material for electrically conductive layer 80 may include, by non-limiting example, silver; nickel; a combination of nickel, lead, and gold; or the like. Similarly, the method for forming electrically conductive layer 80 may be any disclosed in this document.

Although the examples for the material for electrically conductive layer 80 have been metals, other materials may be used in various implementations. For example, layer 80 may be a conductive epoxy. Alternatively, an anti-oxidizing coating or agent may be formed over leadframe leads 54 and on the exposed portions of leadframe leads 54. These types of coatings are electrically non-conductive materials that inhibit the oxidation of metals such as copper at room temperature. During the formation of solder over leadframe leads 54, the anti-oxidizing coating evaporates allowing solder to form on the exposed portions of leadframe leads 54. The anti-oxidizing coating leaves a clean wettable copper surface after it has evaporated to which solder can adhere.

Referring now to FIG. 9, portions of leadframe leads 54 and tie bars 56 remaining in cavities 76 are removed exposing sidewall portions 82 of leadframe leads 54 and portions of mold compound 70, and singulating molded leadframe strip 72 into individual semiconductor components 50. In embodiments in which cavities 76 are formed using a sawing process and molded leadframe strip 72 is singulated using a sawing process, preferably the width of the saw blade used to singulate molded leadframe strip 72 is less than the width of the saw blade used to form cavities 76. The remaining portions of electrically conductive layer 80 provide a wettable material over portions of the surfaces of leadframe leads 54.

Figure 10:
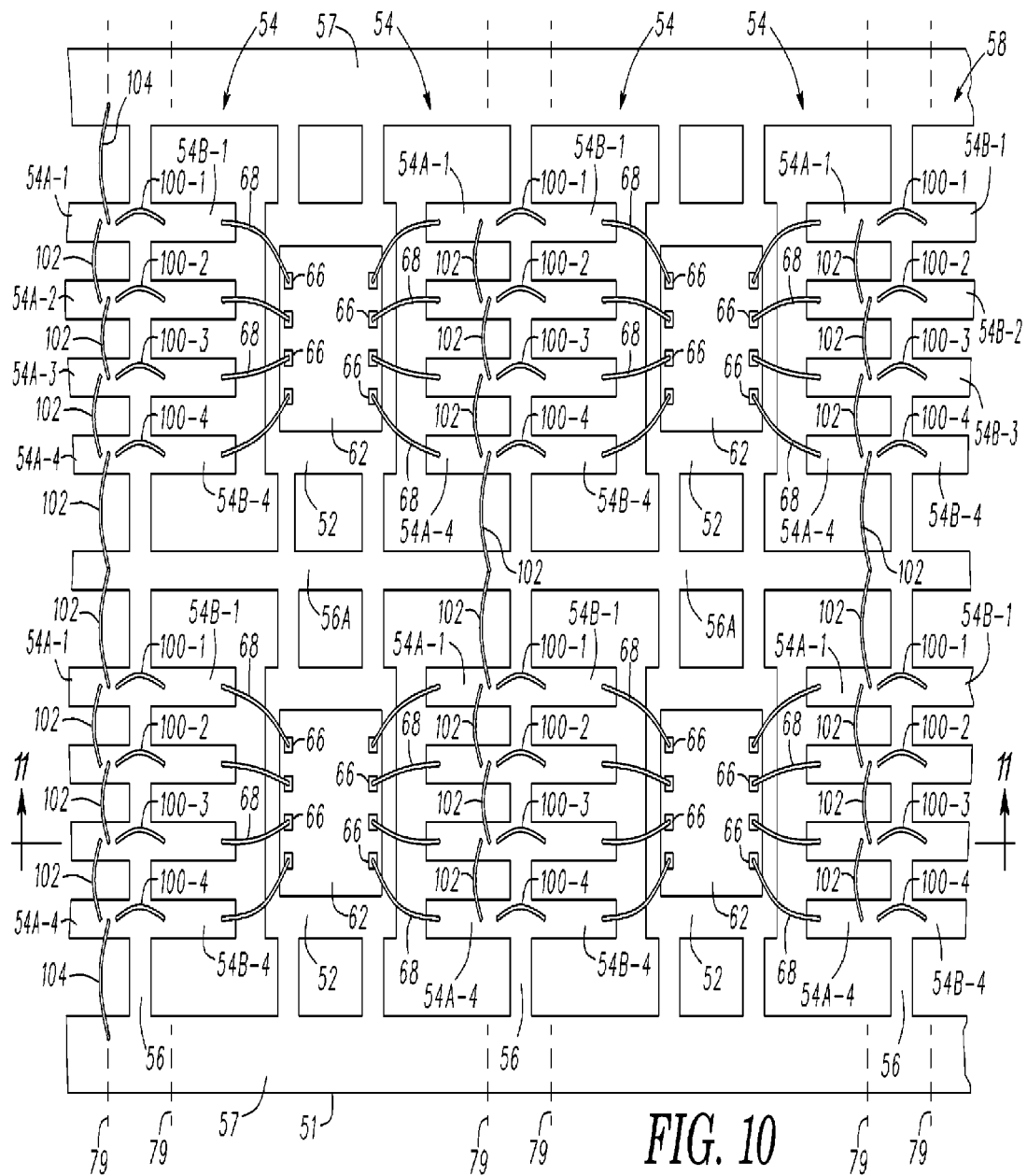
FIG. 10 is a top view of another implementations of a plurality of semiconductor components during manufacture.

FIG. 10 is a top view of a leadframe 51 having flags 52, leadframe leads 54, tie bars 56 and 56A, and opposing sides 58 and 60. Leadframe leads 54 include of leadframe leads 54A-1, 54B-1, 54A-2, 54B-2, 54A-3, 54B-3, 54A-4, and 54B-4, wherein leadframe leads 54A-1 and 54B-1 are on directly opposite sides of tie bars 56, leadframe leads 54A-2 and 54B-2 are on directly opposite sides of tie bars 56, leadframe leads 54A-3 and 54B-3 are on directly opposite sides of tie bars 56, and leadframe leads 54A-4 and 54B-4 are on directly opposite sides of tie bars 56. Semiconductor chips or dice 62 are coupled to side 58 of leadframe 51 through a die attach material 63. More particularly, a semiconductor chip 62 is mounted to each flag 52 through die attach material 63. Semiconductor chips 62 have bond pads 66 that are coupled to corresponding leadframe leads 54 through bond wires 68. Bond wires are also referred to as wirebonds. A wide number of flags 52 and leadframe leads 54 per leadframe may be used in various implementations.

Wirebonds 100-1, 100-2, 100-3, and 100-4 are formed to electrically couple leadframe leads 54A-1, 54A-2, 54A-3, and 54A-4 with leadframe leads 54B-1, 54B-2, 54B-3, and 54B-4, respectively. Wirebonds 102 are formed to electrically couple leadframe leads 54A-1, 54A-2, 54A-3, and 54A-4 to each other and wirebonds 104 are formed to electrically couple leadframe leads 54A-1, 54A-2, 54A-3, 54A-4, 54B-1, 54B-2, 54B-3, and 54B-4 to at least one of rails 57. Alternatively, wirebonds 102 can be formed to electrically couple leadframe leads 54B-1, 54B-2, 54B-3, and 54B-4 to each other. Wirebonds 100-1, 100-2, 100-3, 100-4, 102, and 104 form electrical connections between leadframe leads 54 and rails 57 during the plating process. While the use of wirebonds for electrically connecting leadframe leads 54, tie bars 56, and rails 57 is illustrated, in other implementations, conductive clips may be used to electrically connect leadframe leads 54, tie bars 56, and rails 57.

Like semiconductor components 10 and 50, a mold compound 70 (shown in FIGS. 11-14) is formed over semiconductor chips 62 and wirebonds 68, 100-1, 100-2, 100-3, 100-4, 102, and 104 to form a molded leadframe strip 72A (shown in FIGS. 11-13) that is similar to molded leadframe strip 72. It should be noted that a bottom view of a molded leadframe strip for semiconductor component 150 is similar to the bottom view of molded leadframe strip 72 shown in FIG. 5. A bottom view of the molded leadframe strip is similar to the bottom view shown in FIG. 5. As described above, referring to the views shown in the figures as top views and bottom views and the designation of a view as being a top view or a bottom view is merely to facilitate describing the various implementations illustrated herein.

Figure 11:
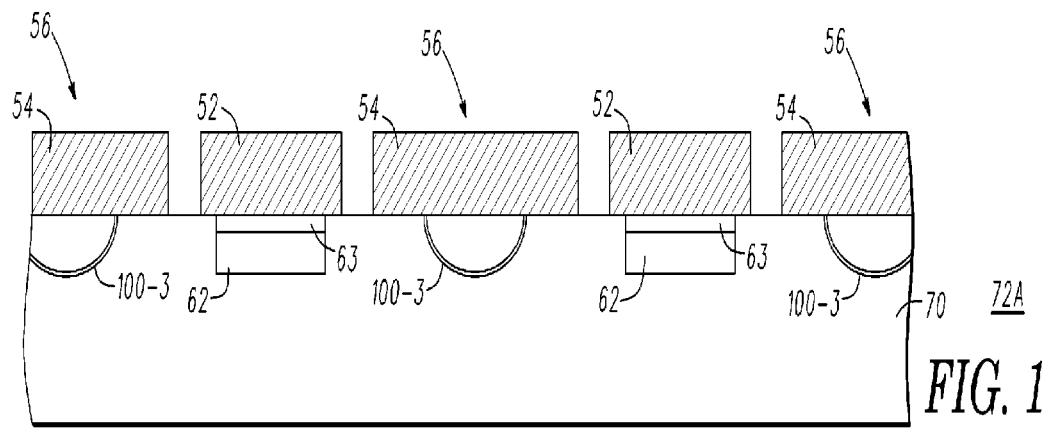
FIG. 11 is a cross-sectional view of the plurality of semiconductor components of FIG. 10 taken along section line 11-11 at a later stage of manufacture.

FIG. 11 is a cross-sectional view of molded leadframe strip 72A taken along the region shown by section line 11-11 of FIG. 10 but at a later step than that shown in FIG. 10. FIG. 11 illustrates portions of leadframe flags 52, leadframe leads 54, die attach material 63, semiconductor chips 62, and wirebonds 100-3.

Figure 12:
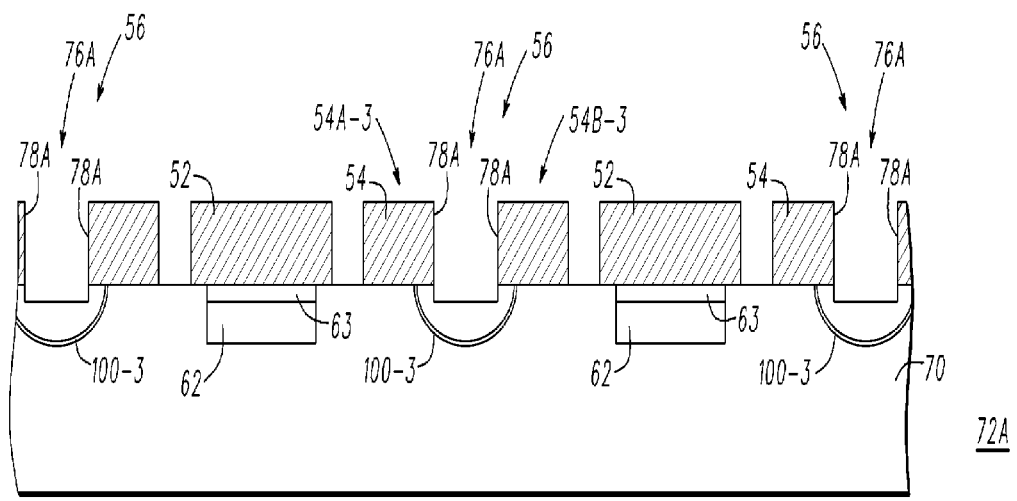
FIG. 12 is a cross-sectional view of the plurality of semiconductor components of FIG. 11 at a later stage of manufacture.

FIG. 12 is a cross-sectional view of molded leadframe strip 72A shown in FIG. 11 but at a later stage of manufacture than the molded leadframe strip shown in FIG. 11. What is shown in FIG. 12 is molded leadframe strip 72A after portions of leadframe 51 and mold compound 70 have been removed. More particularly, portions of leadframe leads 54 and mold compound 70 are removed to form cavities 76A having sidewalls 78A. By way of example, the portions of leadframe leads 54 are removed by sawing into leadframe leads 54, tie bars 56, and mold compound 70. The method for removing leadframe leads 54, tie bars 56 and mold compound 70 may include sawing, cutting, etching, stamping, punching, or the like. The regions at which the portions of leadframe leads 54, tie bars 56, and rails 57 are removed are identified by broken lines 79 shown in FIG. 10.

Figure 13:
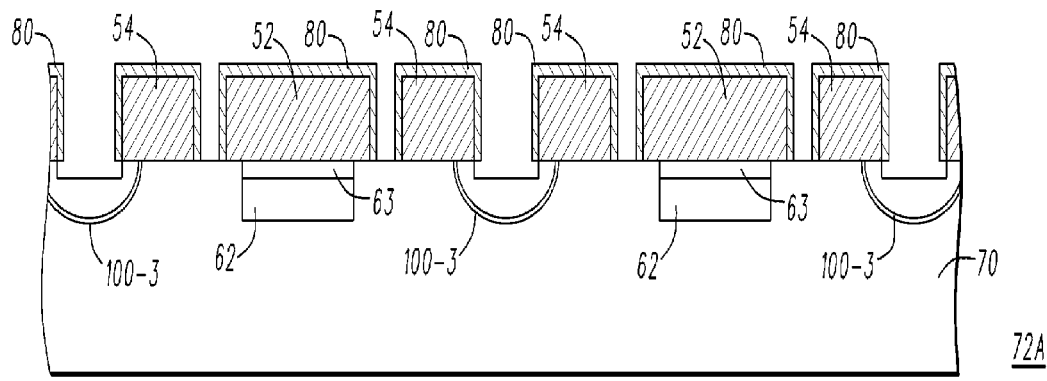
FIG. 13 is a cross-sectional view of the plurality of semiconductor components of FIG. 12 at a later stage of manufacture.

Referring now to FIG. 13, a layer of electrically conductive material 80 having a thickness ranging from about 0.5 microinches (12.7 nanometers) to about 3,000 microinches (76.2 micrometers) is formed on leadframe leads 54, including the portions of leadframe leads 54 within cavities 76A. In various implementations, electrically conductive material 80 is tin formed by an electroplating process using a spouted bed electroplating device or a vibratory plating device and may be formed over more than fifty percent and up to one hundred percent of an outer edge of the least one of the leadframe leads. Electrically conductive material 80 may be referred to as vibratory plated material or the spouted bed electroplated material when formed using a vibratory plating device or a spouted bed electroplating device, respectively, and may be formed over more than fifty percent and up to one hundred percent of an outer edge of the least one of the leadframe leads. The type of electrically conductive material and the method for forming the electrically conductive material may be any disclosed in this document, including silver; nickel; a combination of nickel, lead, and gold; or the like.

As discussed above, electrically conductive layer 80 may not be a metal, but can be a conductive epoxy or an anti-oxidizing coating or agent formed over leadframe leads 54 and on the exposed portions of leadframe leads 54. These types of coatings are electrically non-conductive materials that inhibit the oxidation of metals such as copper at room temperature. During the formation of solder over leadframe leads 54, the anti-oxidizing coating evaporates allowing solder to form on the exposed portions of leadframe leads 54. The anti-oxidizing coating leaves a clean wettable copper surface after it has evaporated to which solder can adhere.

Figure 14:
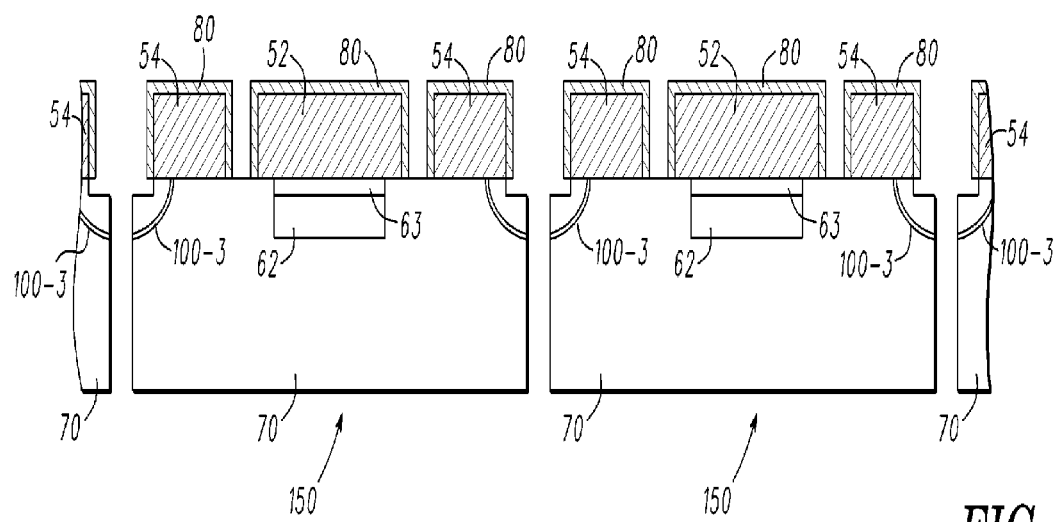
FIG. 14 is a cross-sectional view of the plurality of semiconductor components of FIG. 13 at a later stage of manufacture.

Referring now to FIG. 14, portions of leadframe leads 54 and tie bars 56 remaining in cavities 76A and portions of mold compound 70 are removed forming sidewalls from mold compound 70 and singulating molded leadframe strip 72A into individual semiconductor components 150, i.e., the portions of mold compound 70 exposed by removing the portions of leadframe leads 54 and tie bars 56 are removed to singulate molded leadframe strip 72A into individual semiconductor components 150. In addition, wire bonds 100-1, 100-2, 100-3, 100-4, 102, and 104 are cut, opened, or separated. It should be noted that in various implementations in which wire bonds 102 and 104 are opened using a sawing or cutting process, wire bonds 102 and 104 are cut in a direction substantially perpendicular to wire bonds 100-1, 100-2, 100-3, 100-4. The remaining portions of electrically conductive layer 80 provide a wettable material over surfaces of leadframe leads 54.

Figure 15:
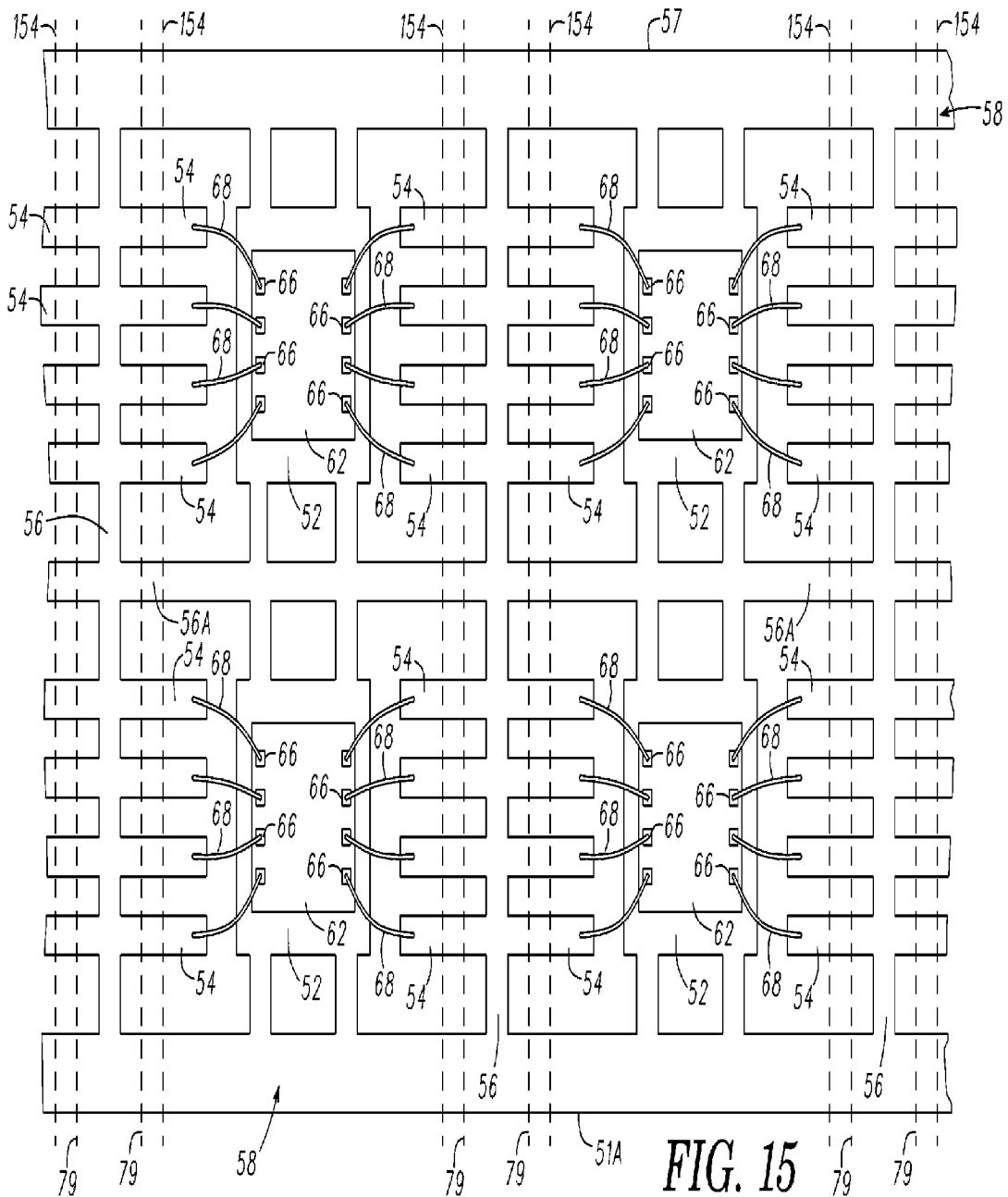
FIG. 15 is a top view of a plurality of semiconductor components during manufacture in accordance with another embodiment of the present invention.
Figure 16:
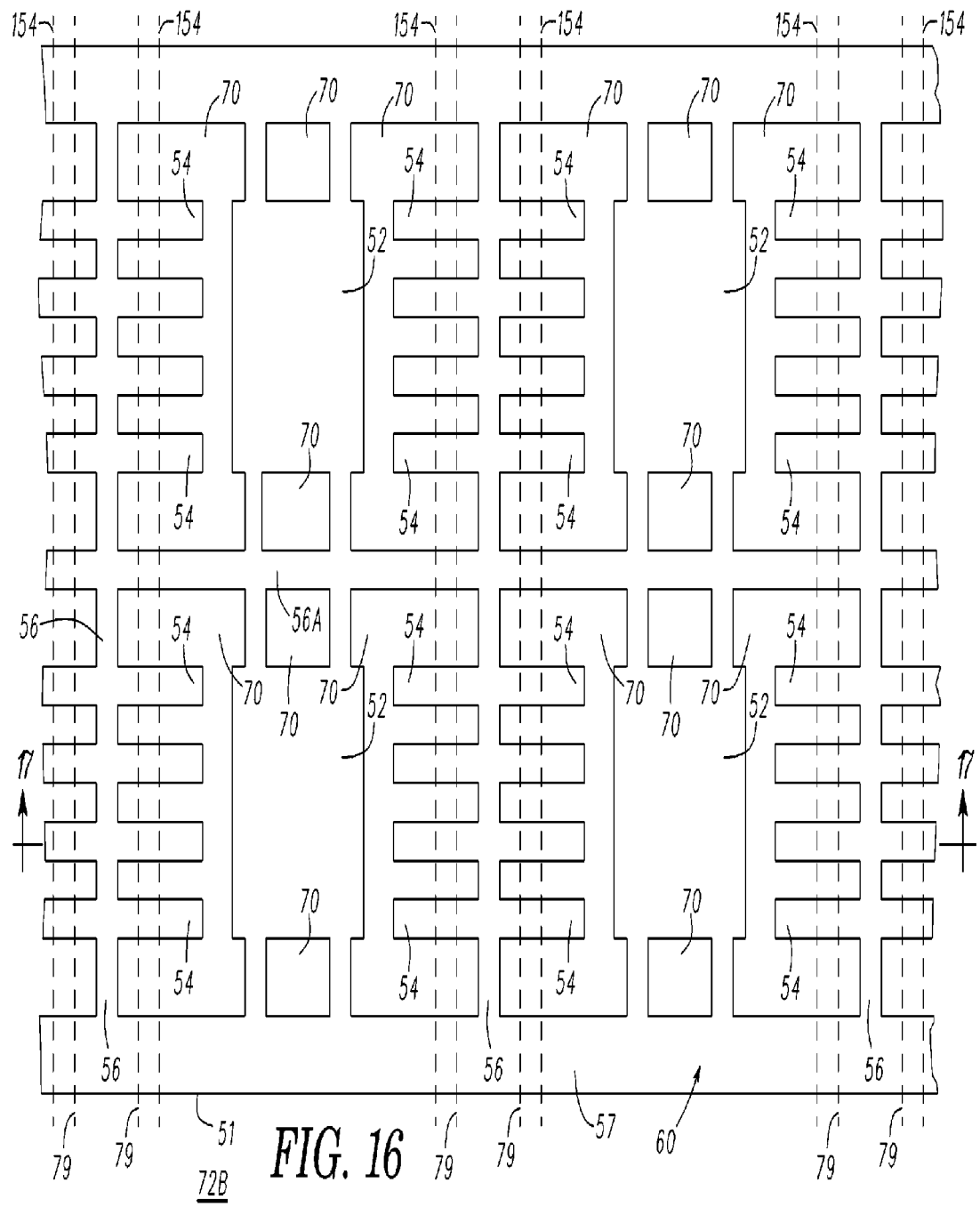
FIG. 16 is a bottom view of the plurality of semiconductor components of FIG. 15 at a later stage of manufacture.
Figure 19:
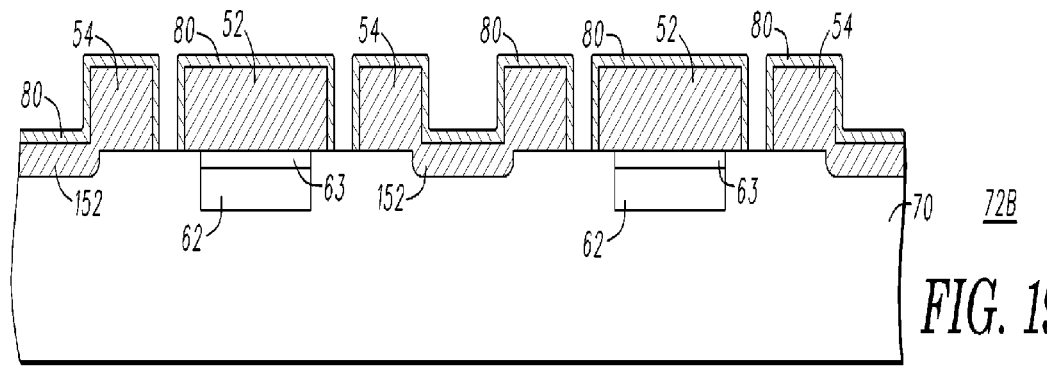
FIG. 19 is a cross-sectional view of the plurality of semiconductor components of FIG. 18 at a later stage of manufacture.
Figure 20:
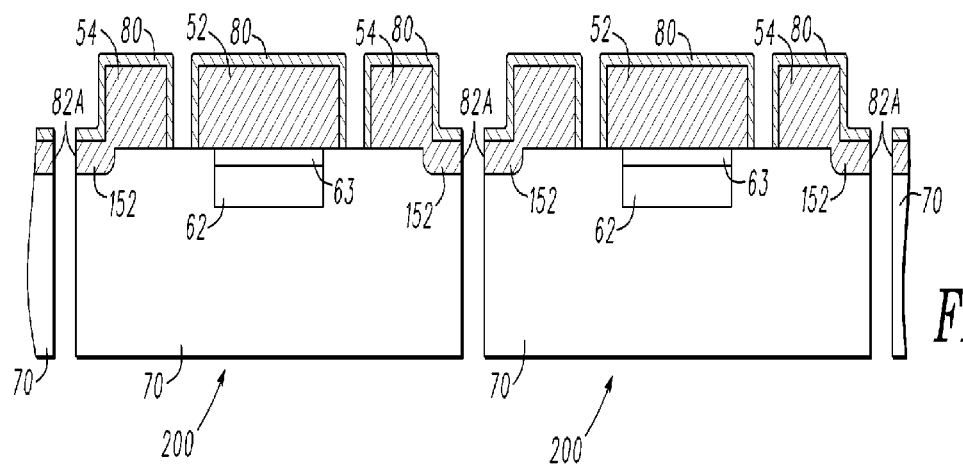
FIG. 20 is a side view of the plurality of semiconductor components of FIG. 19 at a later stage of manufacture.

FIG. 15 is a top view of a portion of a leadframe 51A having a flag 52, leadframe leads 54, tie bars 56 and 56A, rails 57, and opposing sides 58 and 60 (opposing side 60 is illustrated in FIG. 16) used in the manufacture of semiconductor components 200 (shown in FIG. 20). Leadframe 51A is similar to leadframe 51 described with reference to FIG. 4 except that dimples 152 are formed in tie bars 56. Because of this difference, the reference character "A" has been appended to reference character 51. Dimples 152 may be formed by stamping the tie bars of leadframe 51A. The locations of dimples 152 are illustrated by broken lines 154 in FIG. 14. Dimples 152 are shown in FIGS. 17-20. Semiconductor chips or dice 62 are coupled to side 58 of leadframe 51A and bond pads 66 are coupled to corresponding leadframe leads 54 through bond wires 68 as described with reference to FIG. 4. Alternatively and as discussed with reference to FIG. 3, passive circuit elements such as resistors, capacitors, and inductors or other active circuit elements may be coupled to or mounted on leadframe 51A in place of or in addition to semiconductor chips 62.

Referring now to FIG. 16, a bottom view of a portion of leadframe 51 after a mold compound 70 has been formed over semiconductor chips 62 and wirebonds 68 to form a molded leadframe strip 72B is shown. Broken lines 154 indicate where dimples 152 are formed in leadframe 51A. It should be understood that mold compound 70 is formed over side 58, i.e., the top side, leaving side 60 substantially free of mold compound and that FIG. 16 is a bottom view of leadframe 51A. It should be further understood that referring to the views shown in the figures as top views and bottom views and the designation of a view as being a top view or a bottom view is merely to facilitate describing various implementations. Broken lines 79 indicate where portions of leadframe leads 54 are separated and exposed. Broken lines 79 also indicate the regions in which tie bars 56 are removed.

The acts of separating and exposing leadframe leads 54 and removing tie bars 56 are further described with reference to FIG. 18.

A mold compound 70 is formed over semiconductor chips 62 and wirebonds 68 to form a molded leadframe strip 72B as described with reference to FIG. 5. Like FIG. 5, FIG. 16 is a bottom view of molded leadframe strip 72B. The locations of dimples 152 are illustrated by broken lines 154. As discussed above, dimples 152 are shown with reference to FIGS. 17-20. Broken lines 79 indicate where portions or regions of leadframe leads 54 are separated and exposed.

Figure 17:
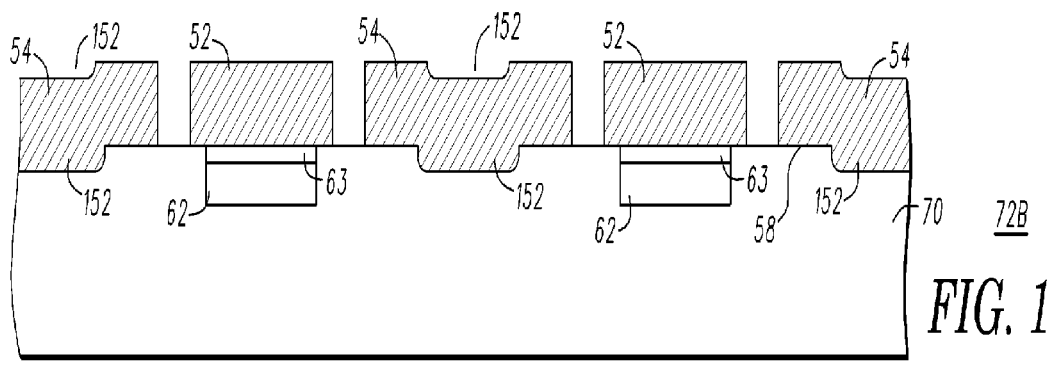
FIG. 17 is a cross-sectional view of the plurality of semiconductor components of FIG. 16 taken along section line 17-17 at a later stage of manufacture.

FIG. 17 is a cross-sectional view of molded leadframe strip 72B taken along section line 17-17 of FIG. 16. FIG. 17 illustrates portions of leadframe flags 52, leadframe leads 54, die attach material 63, semiconductor chips 62, and dimples 152.

Figure 18:
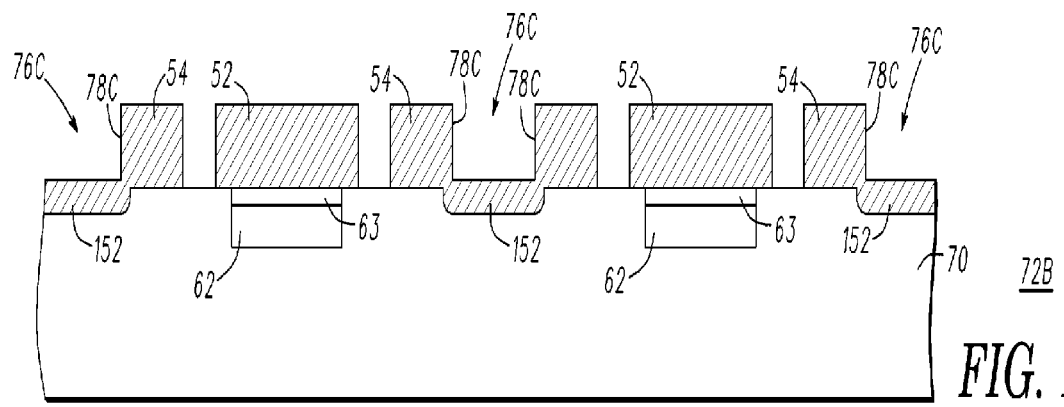
FIG. 18 is a cross-sectional view of the plurality of semiconductor components of FIG. 17 at a later stage of manufacture.

FIG. 18 is a cross-sectional view of molded leadframe strip 72B shown in FIG. 17 at a later stage of manufacture. What is shown in FIG. 18 is molded leadframe strip 72B after portions of leadframe 51A have been removed to form cavities 76C having sidewalls 78C. By way of example, the portions of leadframe leads 54 are removed by partially sawing into leadframe leads 54 and tie bars 56. Preferably, the thicknesses of leadframe leads 54 and tie bars 56 that are removed is less than about 100% of the thickness of leadframe leads 54. In particular implementations, about three-fourths of the thicknesses of leadframes 54 and tie bars 56 are removed. Suitable techniques for removing the portions of leadframe leads 54 include sawing, cutting, etching, stamping, punching, or the like. The regions at which the portions of leadframe leads 54, tie bars 56, and rails 57 are removed are identified by broken lines 79 shown in FIGS. 15 and 16.

Referring now to FIG. 19, a layer of electrically conductive material 80 having a thickness ranging from about 0.5 microinches (12.7 nanometers) to about 3,000 microinches (76.2 micrometers) is formed on leadframe leads 54, including the portions of leadframe leads 54 within cavities 76C. In particular implementations, electrically conductive material 80 is tin formed by an electroplating process in a spouted be electroplating device or a vibratory plating device. Electrically conductive material 80 may be referred to as vibratory plated material or the spouted bed electroplated material when formed using a vibratory plating device or a spouted bed electroplating device, respectively, and may be formed over more than fifty percent and up to one hundred percent of an outer edge of the least one of the leadframe leads. The type of electrically conductive material and the method for forming the electrically conductive material may any disclosed in this document including silver; nickel; a combination of nickel, lead, and gold; or the like.

As discussed above, electrically conductive layer 80 may not be a metal, but can be a conductive epoxy or an anti-oxidizing coating or agent formed over leadframe leads 54 and on the exposed portions of leadframe leads 54. These types of coatings are electrically non-conductive materials that inhibit the oxidation of metals such as copper at room temperature. During the formation of solder over leadframe leads 54, the anti-oxidizing coating evaporates allowing solder to form on the exposed portions of leadframe leads 54. The anti-oxidizing coating leaves a clean wettable copper surface after it has evaporated to which solder can adhere.

Referring now to FIG. 20, portions of leadframe leads 54 and tie bars 56 remaining in cavities 76C are removed exposing sidewall portions of electrically conductive layer 80, sidewall portions 82A of leadframe leads 54, and portions of mold compound 70, and singulating molded leadframe strip 72B into individual semiconductor components 200. In embodiments in which cavities 76C are formed using a sawing process and molded leadframe strip 72B are singulated using a sawing process, preferably the width of the saw blade used to singulate molded leadframe strip 72B is less than the width of the saw blade used to form cavities 76C. The remaining portions of electrically conductive layer 80 provide a wettable material over surfaces of leadframe leads 54.

Figure 21:
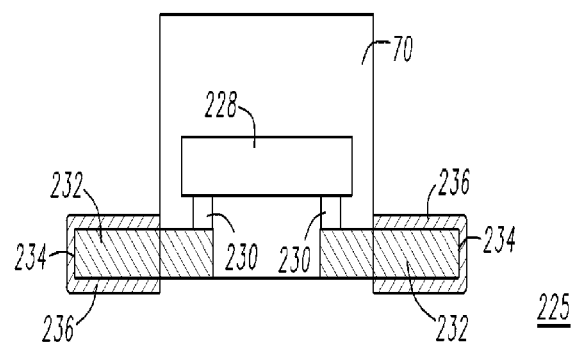
FIG. 21 is a cross-sectional view of another implementation of a semiconductor component.

Referring now to FIG. 21, a cross-sectional view of a semiconductor component 225 is illustrated. Semiconductor component 225 includes a semiconductor chip 228 having bond pads 230 mounted to leadframe leads 232 and protected by a mold compound 70. A material 236 is formed on edges 234 of leadframe leads 232 that were exposed after singulation. Material 236 may be an electrically conductive material or an anti-oxidizing material. Although material 236 is shown as covering all of edges 234, material 236 may cover less than the entirety of edges 234 in various implementations. It should be noted that flags are absent from component 225.

In accordance with another embodiment, a semiconductor component such as, for example semiconductor component 10, 50, 150, 200, or 225, is within an engine compartment of an automobile.

Figure 22:
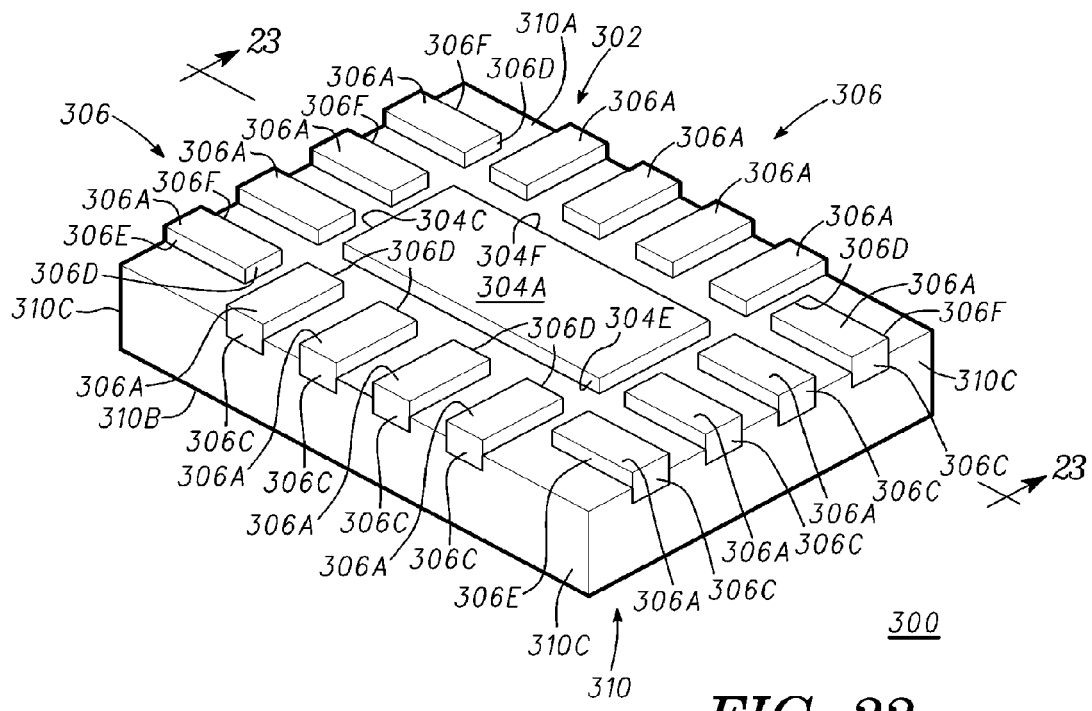
FIG. 22 is an isometric view on another implementation of a semiconductor component during manufacture.
Figure 23:
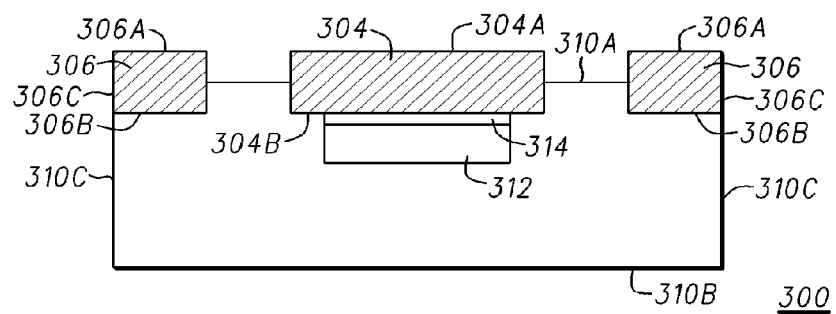
FIG. 23 is a cross-sectional view of the semiconductor component of FIG. 22 taken along section line 23-23 of FIG. 22.

FIG. 22 is an isometric view of another implementation of a semiconductor component 300 during manufacture. FIG. 23 is a cross-sectional view of semiconductor component 300 taken along section line 23-23 of FIG. 22. For the sake of clarity, FIGS. 22 and 23 will be described together. FIGS. 22 and 23 illustrate a portion of an electrically conductive support 302 that includes a device or component receiving structure 304 and interconnect structures 306 partially embedded in a mold compound 310. In various implementations, electrically conductive support 302 is a portion of a leadframe such as, for example, leadframe 51 described with reference to FIG. 4. Device receiving structure 304 has opposing major surfaces 304A and 304B and minor surfaces 304C, 304D, 304E, and 304F. Minor surfaces 304C-304F may be referred to as edges. Major surface 304B serves as a device attach or device receiving area. Interconnect structures 306 have opposing major surfaces 306A and 306B and minor surfaces 306C, 306D, 306E, and 306F. Surfaces 306C are on one side of semiconductor component 300 and surfaces 306D are on a side opposite to the side on which surfaces 306C are located. In various implementations in which electrically conductive support 302 is a leadframe, device receiving structure 304 may be referred to as a flag, a die attach paddle, or a die attach pad, and interconnect structures 306 may be referred to as leadframe leads. The distance between major surface 304A and major surface 304B is referred to as a thickness of device receiving structure 304. The distance between major surface 306A and major surface 306B may be referred to as the thickness of leadframe lead 306. Electrically conductive support 302 is embedded in a mold compound 310, which mold compound 310 has major surfaces 310A and 310B and minor surfaces 310C. In implementations, at least 20 percent (%) of the thickness of electrically conductive support 302 is embedded in mold compound 310. In other implementations, at least 50% of the thickness of electrically conductive support 302 is embedded in mold compound 310. In other implementations, at least 90% of the thickness of electrically conductive support 302 is embedded in mold compound 310. It should be noted that the amount of material embedded in mold compound 310 should be enough to secure conductive support 302 in mold compound 310. It should further noted that surfaces 304A and 306A are vertically spaced apart from surface 310A.

FIG. 23 further illustrates a semiconductor chip or die 312 mounted to device receiving area 304B of die attach paddle 304. More particularly, a die attach material 314 is deposited on device receiving area 304B and a semiconductor chip 312 is positioned on die attach material 314 so that semiconductor chip 312 is mounted to device receiving area 304B of die attach paddle through a die attach material 314.

It should be understood that semiconductor component 300 is a single component that has been singulated from a molded leadframe strip (described with reference to FIG. 20) using a sawing technique and may be referred to as outer edges of the interconnect structure. Thus, surfaces 306C of interconnect structures 306 are substantially planar with corresponding minor surfaces 310C of mold compound 310.

Figure 24:
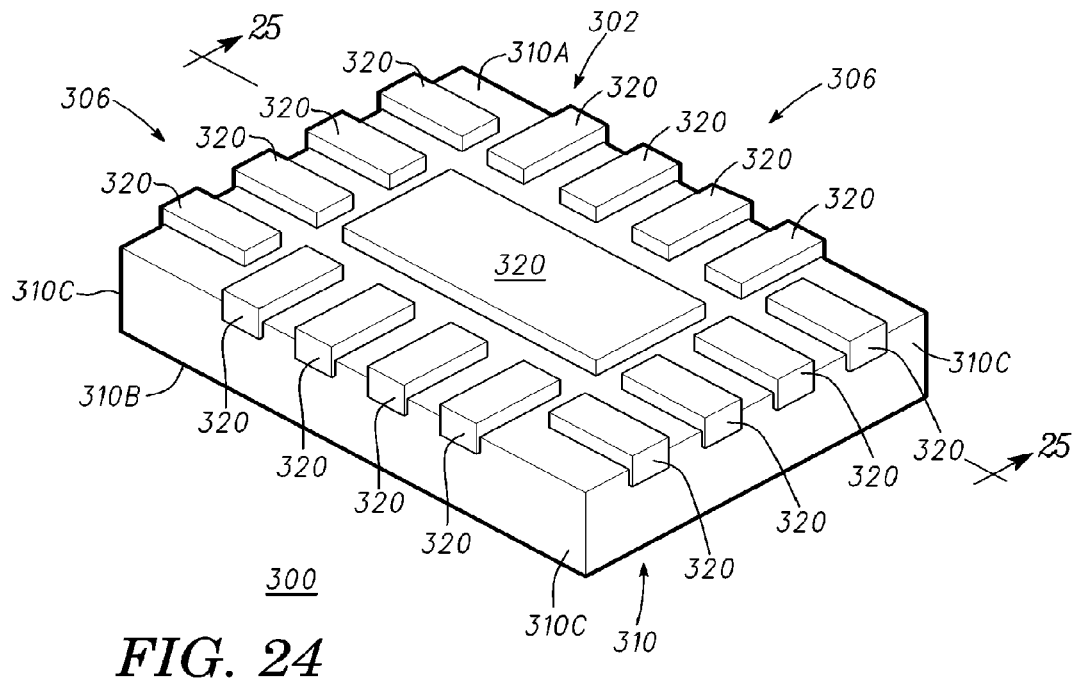
FIG. 24 is an isometric view the semiconductor component of FIG. 22 at a later stage of manufacture.
Figure 25:
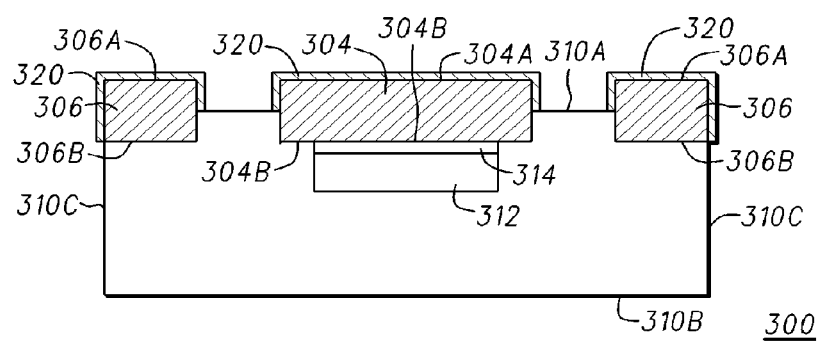
FIG. 25 is a cross-sectional view of the semiconductor component of FIG. 24 taken along section line 25-25 of FIG. 24.

FIG. 24 is an isometric view of semiconductor component 300 shown in FIGS. 22 and 23 at a later stage of manufacture. FIG. 25 is a cross-sectional view of semiconductor component 300 taken along section line 25-25 of FIG. 24. For the sake of clarity, FIGS. 24 and 25 will be described together. A layer of electrically conductive material 320 is formed on the exposed portions of device receiving structure 304 and interconnect structures 306, i.e., on the exposed portions of surfaces 304A and 304C-304F. Electrically conductive material 320 is not formed on the portions of device receiving area 304 and interconnect structures 306 within or surrounded by mold compound 310. Electrically conductive layers 320 are formed using, for example, an electroplating process such as a spouted bed electroplating process or a vibratory plating process. The spouted bed electroplating process may be performed in a spouted bed electroplating device and the vibratory plating process may be performed in a vibratory plating device. Electrically conductive material 320 may be referred to as a spouted bed electroplated material when formed using a spouted bed electroplating device for its formation or a vibratory plated material when formed using a vibratory plating device for its formation. By way of example, the spouted bed electroplated material or the vibratory plated material may have a thickness at least about 2 micrometers (μm) and may be formed on up to one hundred percent of a surface 306C of least one of the interconnect structures 306. Layers 320 are further illustrated in FIG. 25, which figure shows that after plating, layers 320 on surface 306C extend out of the plane formed by surfaces 306C and 310C.

In various implementations, the material of electrically conductive layer 320 is tin. The material of electrically conductive layer 320 may include, by non-limiting example, lead; solder; a combination of tin and lead; silver; nickel; a combination of nickel, lead, and gold; or the like. Similarly, the method for forming electrically conductive layer 320 may be any disclosed in this document. Layer of electrically conductive material 320 may cover or partially cover surfaces 306C-306F. An advantage of forming layer of electrically conductive material 320 is that it forms a wettable material over edges or surface 306C-306F that is useful in mounting the semiconductor component in end user applications.

Figure 26:
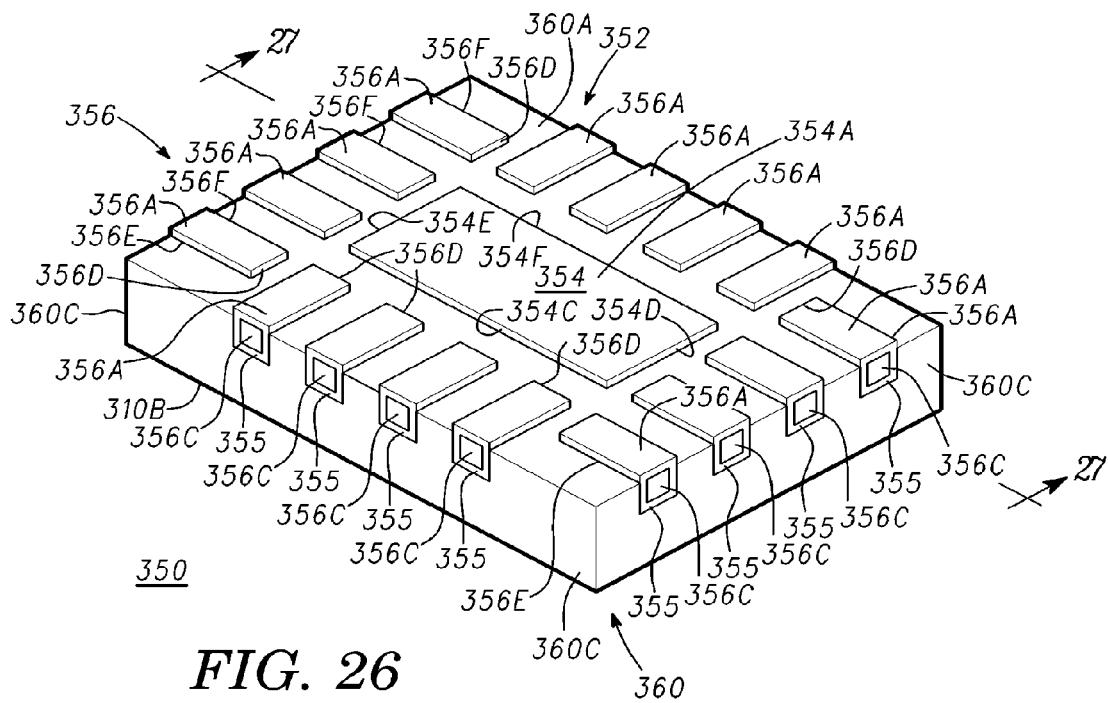
FIG. 26 is an isometric view of another implementation of a semiconductor component during manufacture.
Figure 27:
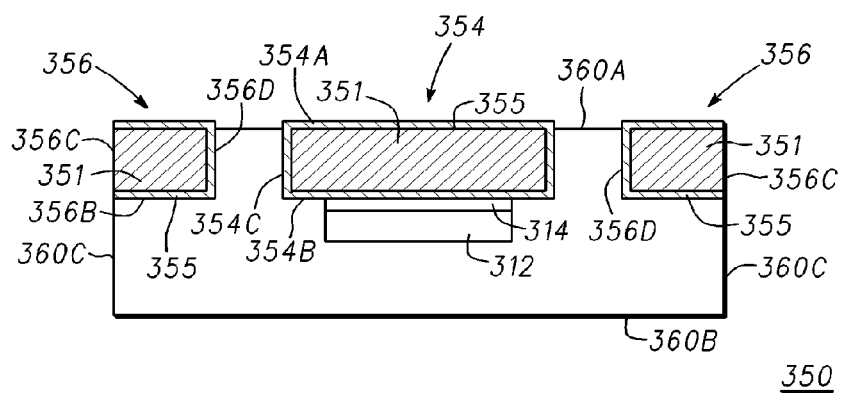
FIG. 27 is a cross-sectional view of the semiconductor component of FIG. 26 taken along section line 27-27 of FIG. 26.

FIG. 26 is an isometric view of another implementation of a semiconductor component 350 during manufacture. FIG. 27 is a cross-sectional view of semiconductor component 350 taken along section line 27-27 of FIG. 26. For the sake of clarity, FIGS. 26 and 27 will be described together. FIGS. 26 and 27 illustrate a portion of an electrically conductive support 352 that includes a device or component receiving structure 354 and interconnect structures 356 partially embedded in a mold compound 360. In various implementations, electrically conductive support 352 is a portion of a leadframe 351 such as, for example, leadframe 51 described with reference to FIG. 4 that is coated with an electrically conductive material 355. In other implementations, layer of electrically conductive material 355 is formed on leadframe 351 to form electrically conductive support structure 352 having device or component receiving structure 354 and interconnect structures 356. By way of example, electrically conductive layer 355 is electroplated onto leadframe 351. Suitable materials for electrically conductive layer 355 include nickel, palladium, gold, or the like. Device receiving structure 354 has opposing major surfaces 354A and 354B and minor surfaces 354C, 354D, 354E, and 354F. Minor surfaces 354C-354F may be referred to as edges. Major surface 354B serves as a device attach or device receiving area.

Semiconductor component 350 is singulated from a molded leadframe strip (described with reference to FIG. 20) using a sawing technique and may be referred to as outer edges of the interconnect structure. Thus, surfaces 356C of interconnect structures 356 are substantially planar with corresponding minor surfaces 360C of mold compound 360. Surfaces 356C are on one side of semiconductor component 350 and surfaces 356D are on a side opposite to the side on which surfaces 356C are located. Because semiconductor component 350 has been singulated from a molded leadframe strip, surfaces 356C are comprised of the copper of leadframe 351 surrounded by electrically conductive layer 355.

Interconnect structures 356 have opposing major surfaces 356A and 356B and minor surfaces 356C, 356D, 356E, and 356F. In those implementations in which electrically conductive support 352 is a leadframe, device receiving structure 354 may be referred to as a flag, die attach paddle, or die attach pad and interconnect structures 356 may be referred to as leadframe leads. The distance between major surface 354A and major surface 354B is referred to as a thickness of device receiving structure 354. The distance between major surface 356A and major surface 356B may be referred to as the thickness of leadframe leads 356. Electrically conductive support 352 is embedded in mold compound 360, which mold compound 360 has major surfaces 360A and 360B and minor surfaces 360C. In implementations, at least 20 percent (%) of the thickness of electrically conductive support 352 is embedded in mold compound 360. In other implementations, at least 50% of the thickness of electrically conductive support 352 is embedded in mold compound 360. In particular implementations, at least 90% of the thickness of electrically conductive support 352 is embedded in mold compound 360. It should noted that the amount of material embedded in mold compound 360 should be enough to secure conductive support 352 in mold compound 360. It should further noted that surfaces 354A and 356A are vertically spaced apart from surface 360A.

FIG. 27 further illustrates a semiconductor chip or die 312 mounted to device receiving area 354B. More particularly, a die attach material 314 is deposited on device receiving area 354B and a semiconductor chip 312 is positioned on die attach material 314. Semiconductor chip 312 is shown as being mounted to device receiving are 354B through a die attach material 314.

Figure 28:
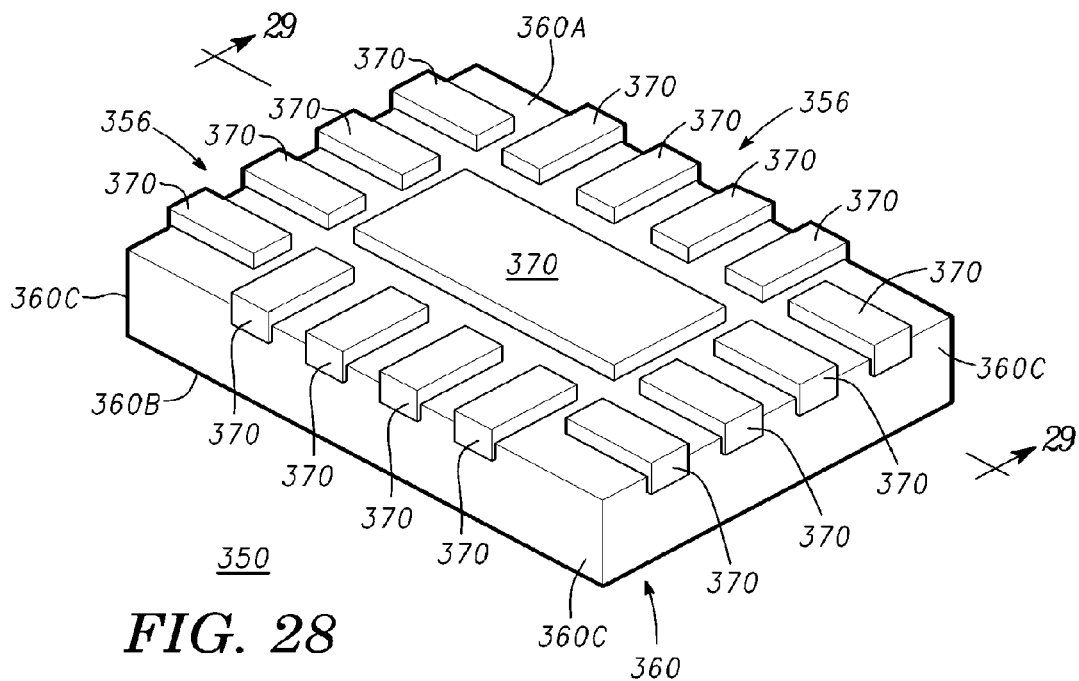
FIG. 28 is an isometric view the semiconductor component of FIG. 26 at a later stage of manufacture.
Figure 29:
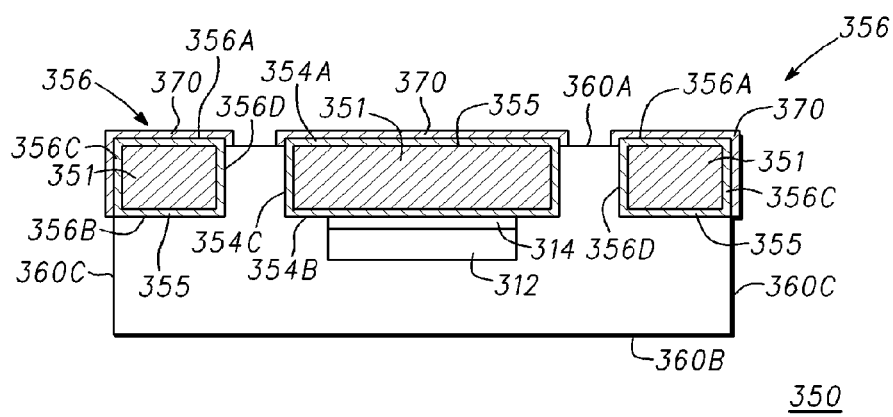
FIG. 29 is a cross-sectional view of the semiconductor component of FIG. 28 taken along section line 29-29 of FIG. 28.

FIG. 28 is an isometric view of semiconductor component 350 shown in FIGS. 24 and 25 at a later stage of manufacture. FIG. 29 is a cross-sectional view of semiconductor component 350 taken along section line 29-29 of FIG. 28. For the sake of clarity, FIGS. 28 and 29 will be described together. A layer of electrically conductive material 370 is formed on the exposed portions of device receiving structure 354 and interconnect structures 356, i.e., on the exposed portions of surfaces 354A and 354C-354F of device receiving structure 354 and on surfaces 356A and 356C-356F of interconnect structures 356. Electrically conductive material 370 is not formed on the portions of device receiving area 354 and interconnect structures 356 within or surrounded by mold compound 360. Electrically conductive layers 370 are formed using, for example, an electroplating process such as a spouted bed electroplating process or a vibratory plating process. The spouted bed electroplating process may be performed in a spouted bed electroplating device and the vibratory plating process may be performed in a vibratory plating device. Electrically conductive material 370 may be referred to as a spouted bed electroplated material when formed using a spouted bed electroplating device or a vibratory plated material when formed using a vibratory plating device. By way of example, the spouted bed electroplated material or the vibratory plated material may have a thickness of at least about 2 µm and may be formed on up to one hundred percent of a surface 356C of the least one of the interconnect structures 356. Layers 370 are further illustrated in FIG. 29. In accordance with an embodiment, the material of electrically conductive layer 370 is tin. The material of electrically conductive layer 370 may include, by non-limiting example, lead; solder; a combination of tin and lead; silver; nickel; a combination of nickel, lead, and gold; or the like. Similarly, the method for forming electrically conductive layer 370 may be any disclosed in this document. Layer of electrically conductive material 370 may cover or partially cover surfaces 356C-356F. An advantage of forming layer of electrically conductive material 370 may be that it forms a wettable material over surfaces 356C-356F that is useful in mounting the semiconductor component in end user applications.

Figure 30:
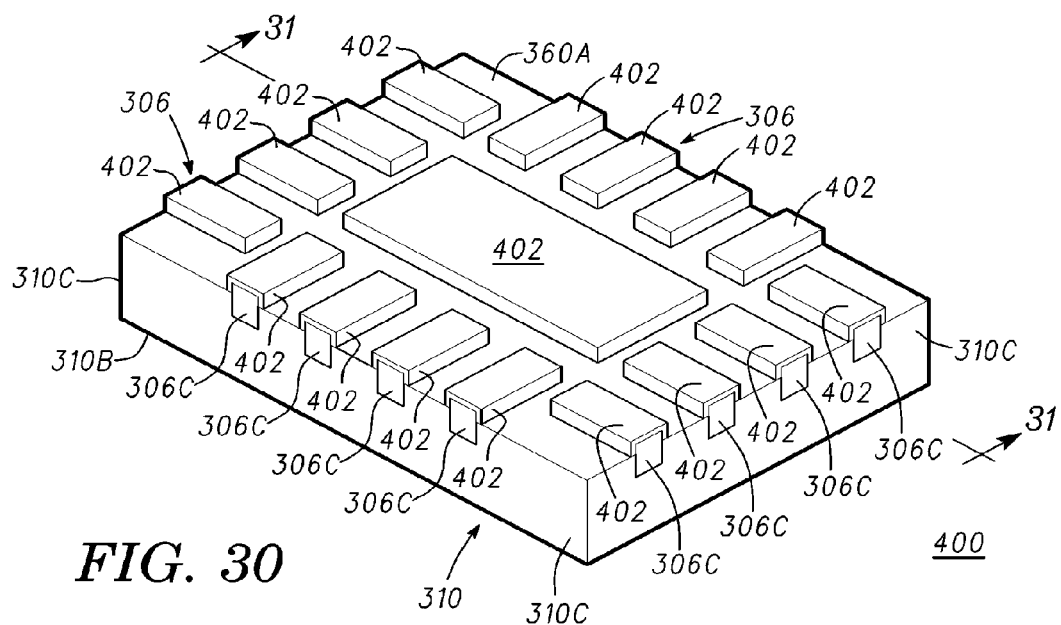
FIG. 30 is an isometric view of another implementation of a semiconductor component during manufacture.
Figure 31:
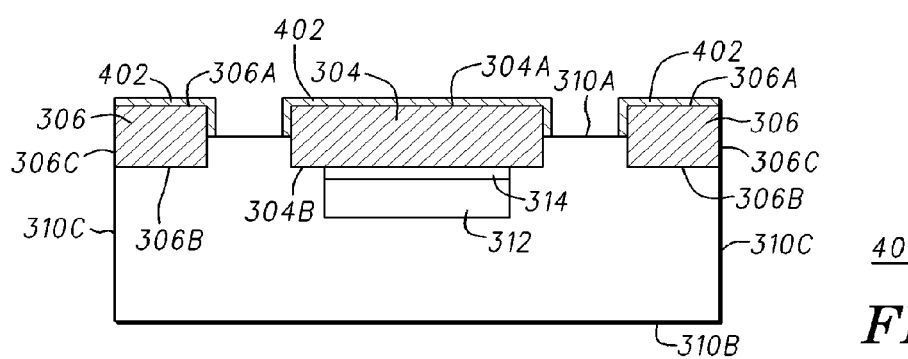
FIG. 31 is a cross-sectional view of the semiconductor component of FIG. 30 taken along section line 31-31 of FIG. 30.

FIG. 30 is an isometric view of another implementation of a semiconductor component 400 during manufacture. FIG. 31 is a cross-sectional view of semiconductor component 400 taken along section line 31-31 of FIG. 30. For the sake of clarity, FIGS. 30 and 31 will be described together. The manufacture of semiconductor component 400 is similar to that of semiconductor component 300 described with reference to FIGS. 22 and 23. Accordingly, the description of FIG. 30 continues from the description of FIGS. 22 and 23. A layer of electrically conductive material 402 is formed over device or component receiving structure 304 and interconnect structures 306. Electrically conductive material 402 may be tin, lead, solder, a combination of tin and lead, or the like. Electrically conductive material 402 is absent from end surfaces 306C of interconnect structures 306. Thus, end surfaces 306C are exposed regions of interconnect structures 306. When interconnect structures 306 are copper, end surfaces 306C are exposed regions of copper. By way of example, end surfaces 306C are exposed when semiconductor components 400 are separated or singulated from a leadframe strip (not shown) using a sawing technique and may be referred to as outer edges of the leadframe lead. Because interconnect structures 306 are singulated using a sawing technique, surfaces 306C of interconnect structures 306 are substantially planar with corresponding minor surfaces 310C of mold compound 310.

FIG. 31 further illustrates die attach pad or flag 304, leadframe leads 306, and electrically conductive layer 402. For the sake of completeness, a semiconductor chip 312 is shown as being mounted to leadframe flag 304B through a die attach material 314.

Figure 32:
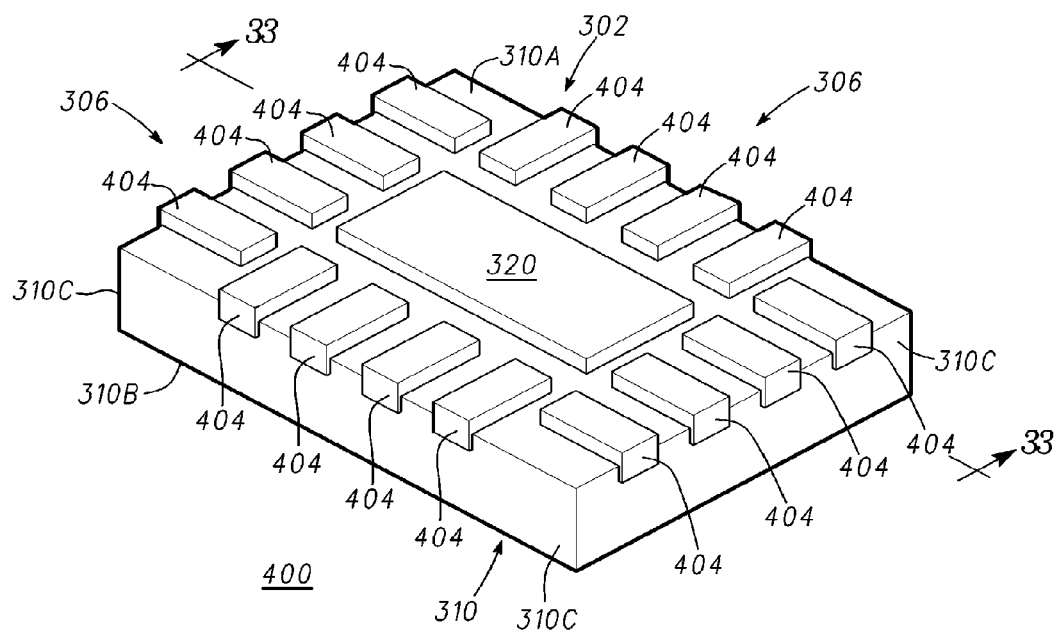
FIG. 32 is an isometric view the semiconductor component of FIG. 30 at a later stage of manufacture.

Referring now to FIG. 32, an electrically conductive material 404 is formed on electrically conductive layer 402 and on end surfaces 306A using, for example, an electroplating process such as a spouted bed electroplating process or a vibratory plating process. The spouted bed electroplating process may be performed in a spouted bed electroplating device and the vibratory plating process may be performed in a vibratory plating device. Electrically conductive material 404 may be referred to as vibratory plated material or the spouted bed electroplated material when formed using a vibratory plating device or a spouted bed electroplating device, respectively, and may be formed on up to one hundred percent of the outer edge of the least one of the plurality of leads. Layers 404 are further illustrated in FIG. 33. In various implementations, the material of electrically conductive layer 404 is tin. The material of electrically conductive layer 404 may include, by non-limiting example, lead; solder; a combination of tin and lead; silver; nickel; a combination of nickel, lead, and gold; or the like. Similarly, the method for forming electrically conductive layer 404 may be any disclosed in this document. Layer of electrically conductive material 404 may cover or partially cover surfaces 306C. An advantage of forming layers of electrically conductive material 404 is that it forms a wettable material over surfaces 306C.

Figure 33:
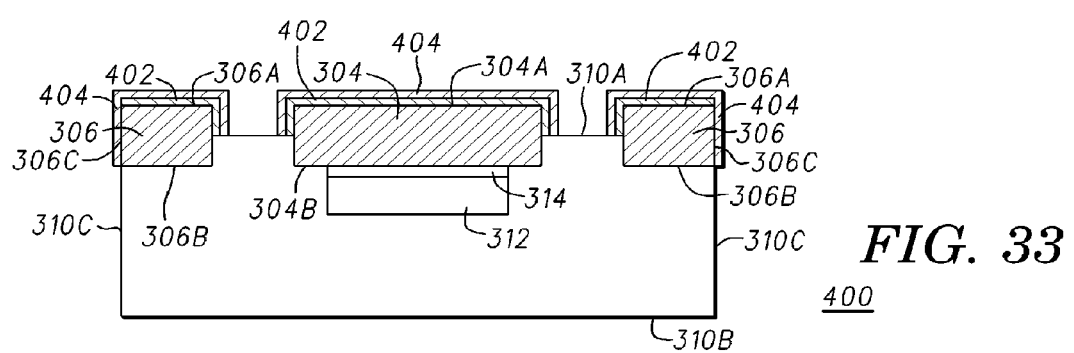
FIG. 33 is a cross-sectional view of the semiconductor component of FIG. 32 taken along section line 33-33 of FIG. 32.

FIG. 33 is a cross-sectional view of semiconductor component 10 taken along section line 33-33 of FIG. 32. FIG. 33 further illustrates device receiving structure 304, interconnect structures 306, and electrically conductive layers 404. For the sake of completeness, a semiconductor chip 312 is shown as being mounted to device receiving structure 304 through a die attach material 314.

Figure 34:
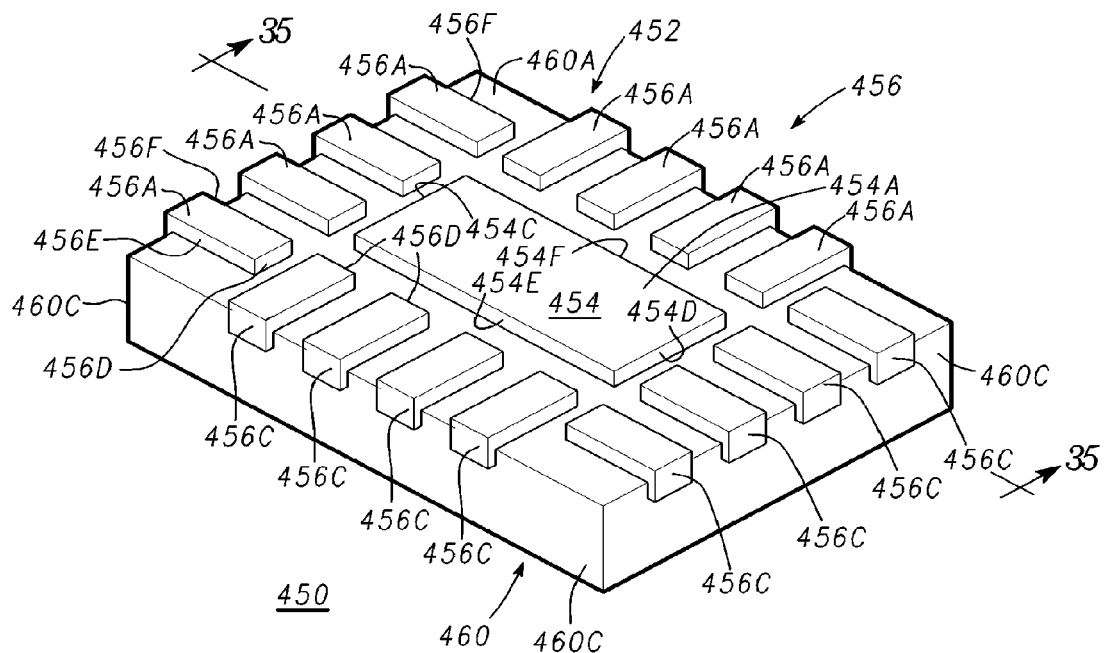
FIG. 34 is an isometric view of another implementation of a semiconductor component during manufacture.
Figure 35:
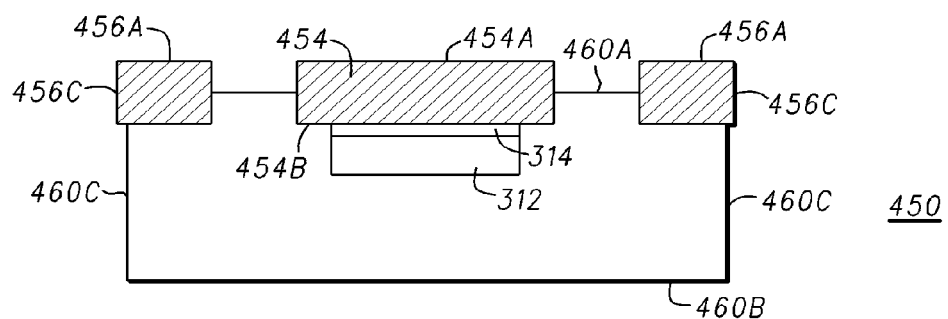
FIG. 35 is a cross-sectional view of the semiconductor component of FIG. 34 taken along section line 35-35 of FIG. 34.

FIG. 34 is an isometric view of another implementation of a semiconductor component 450 during manufacture. FIG. 35 is a cross-sectional view of semiconductor component 450 taken along section line 35-35 of FIG. 34. For the sake of clarity, FIGS. 34 and 35 will be described together. FIGS. 34 and 35 illustrate a portion of an electrically conductive support 452 that includes a device or component receiving structure 454 and interconnect structures 456 partially embedded in a mold compound 460. In implementations, electrically conductive support 452 is a portion of a leadframe such as, for example, leadframe 51 described with reference to FIG. 4. Device receiving structure 454 has opposing major surfaces 454A and 454B and minor surfaces 454C, 454D, 454E, and 454F. Minor surfaces 454C-454F may be referred to as edges. Major surface 454B serves as a device attach or device receiving area. Interconnect structures 456 have opposing major surfaces 456A and 456B and minor surfaces 456C, 456D, 456E, and 456F. Surfaces 456C are on one side of semiconductor component 450 and surfaces 456D are on a side opposite to the side on which surfaces 456C are located. In implementations in which electrically conductive support 452 is a leadframe, device receiving structure 454 may be referred to as a flag, a die attach paddle, or a die attach pad, and interconnect structures 456 may be referred to as leadframe leads. The distance between major surface 454A and major surface 454B is referred to as a thickness of device receiving structure 454. The distance between major surface 456A and major surface 456B may be referred to as the thickness of leadframe lead 456. Electrically conductive support 452 is embedded in a mold compound 460, which mold compound 460 has major surfaces 460A and 460B and minor surfaces 460C. In implementations, at least 20 percent (%) of the thickness of electrically conductive support 452 is embedded in mold compound 460. In other implementations, at least 50% of the thickness of electrically conductive support 452 is embedded in mold compound 460. In particular implementations, at least 90% of the thickness of electrically conductive support 452 is embedded in mold compound 460. It should be noted that the amount of material embedded in mold compound 460 should be enough to secure conductive support 452 in mold compound 460. It should further noted that surfaces 454A and 456A are vertically spaced apart from surface 460A.

FIG. 35 further illustrates a semiconductor chip or die 312 mounted to device receiving area 454B of die attach paddle 454. More particularly, a die attach material 314 is deposited on device receiving area 454B and a semiconductor chip 312 is positioned on die attach material 314 so that semiconductor chip 312 is mounted to device receiving area 454B of die attach paddle through a die attach material 314.

It should be understood that semiconductor component 450 is a single component that has been singulated from a molded leadframe strip (described with reference to FIG. 20) using a trim technique. A trim technique may leave surfaces 456C of leadframes 456 protruding from corresponding surfaces 460C of mold compound 460, i.e., surfaces 456C of leadframe leads 456 are spaced apart from corresponding surfaces 460C of mold compound 460.

Figure 36:
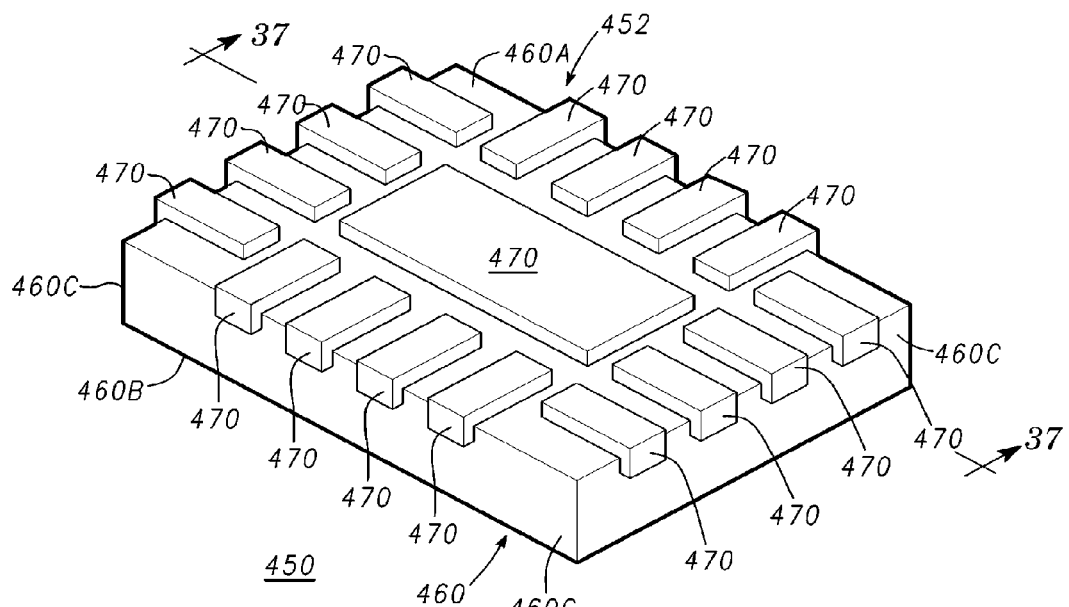
FIG. 36 is an isometric view the semiconductor component of FIG. 34 at a later stage of manufacture.
Figure 37:
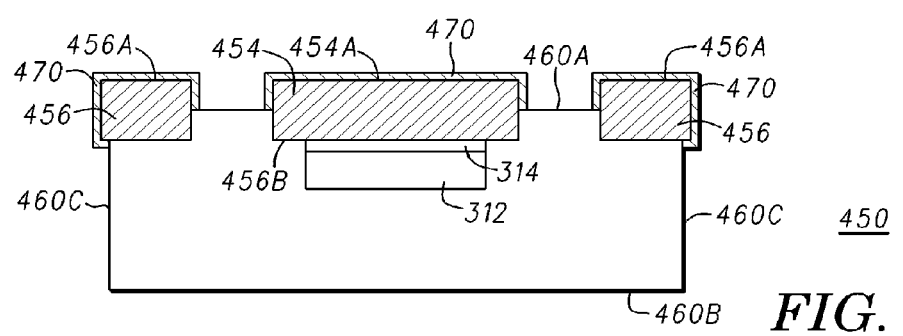
FIG. 37 is a cross-sectional view of the semiconductor component of FIG. 36 taken along section line 37-37 of FIG. 36.

FIG. 36 is an isometric view of semiconductor component 450 shown in FIGS. 34 and 35 at a later stage of manufacture. FIG. 37 is a cross-sectional view of semiconductor component 450 taken along section line 37-37 of FIG. 36. For the sake of clarity, FIGS. 36 and 37 will be described together. A layer of electrically conductive material 470 is formed on the exposed portions of device receiving structure 454 and interconnect structures 456, i.e., on the exposed portions of surfaces 454A and 454C-454F. Electrically conductive material 470 is not formed on the portions of device receiving area 454 and interconnect structures 456 within or surrounded by mold compound 460. Electrically conductive layers 470 are formed using, for example, an electroplating process such as a spouted bed electroplating process or a vibratory plating process. The spouted bed electroplating process may be performed in a spouted bed electroplating device and the vibratory plating process may be performed in a vibratory plating device. Electrically conductive material 470 may be referred to as a spouted bed electroplated material when formed using a spouted bed electroplating device for its formation or a vibratory plated material when formed using a vibratory plating device for its formation. By way of example, the spouted bed electroplated material or the vibratory plated material may have a thickness at least about 2 micrometers (μm) and may be formed on up to one hundred percent of a surface 456C of least one of the interconnect structures 456. Layers 470 are further illustrated in FIG. 37, which figure shows that after plating, layers 470 on surface 456C extend further out of the plane formed by surface 460C.

In implementations, the material of electrically conductive layer 470 is tin. The material of electrically conductive layer 470 may include, by non-limiting example, lead; solder; a combination of tin and lead; silver; nickel; a combination of nickel, lead, and gold; or the like. Similarly, the method for forming electrically conductive layer 470 may be any disclosed in this document. The layer of electrically conductive material 470 may cover or partially cover surfaces 456C-456F. An advantage of forming layer of electrically conductive material 470 may be that it forms a wettable material over edges or surface 456C-456F that is useful in mounting the semiconductor component in end user applications.

Figure 38:
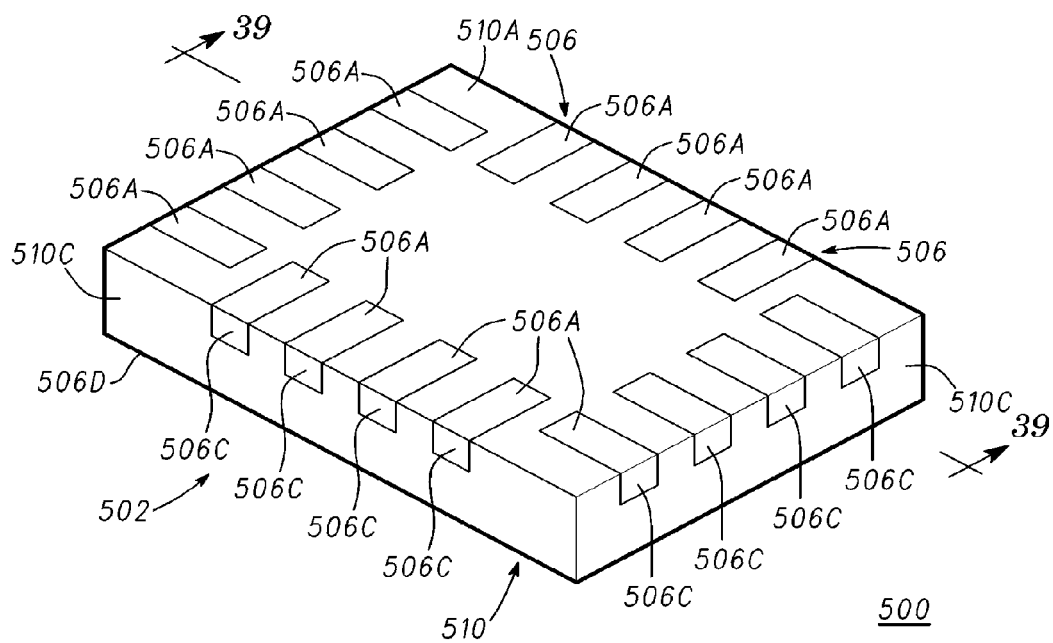
FIG. 38 is an isometric view of another implementation of a semiconductor component during manufacture.
Figure 39:
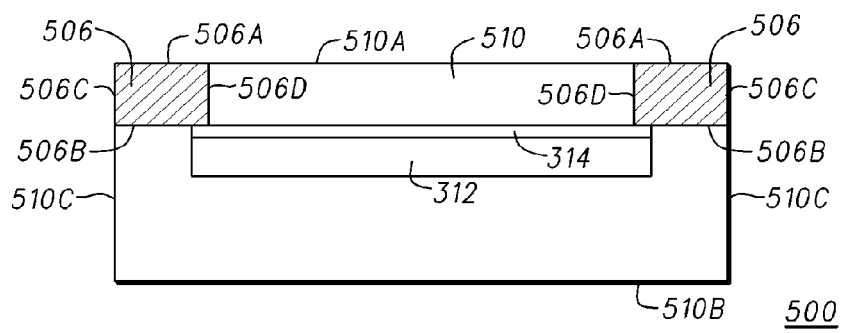
FIG. 39 is a cross-sectional view of the semiconductor component of FIG. 38 taken along section line 39-39 of FIG. 38.

FIG. 38 is an isometric view of another implementation of a semiconductor component 500 during manufacture. FIG. 39 is a cross-sectional view of semiconductor component 500 taken along section line 39-39 of FIG. 38. For the sake of clarity, FIGS. 38 and 39 will be described together. FIGS. 38 and 39 illustrate a portion of an electrically conductive support 502 that includes interconnect structures 506 partially embedded in a mold compound 510. In various implementations, electrically conductive support 502 is a portion of a leadframe that does not include a flag or die attach paddle. Interconnect structures 506 have opposing major surfaces 506A and 506B and minor surfaces 506C and 506D. It should be noted that interconnect structure 506 has surfaces that are perpendicular to surfaces 506C and 506D that are not shown because they are embedded in mold compound 510. In accordance with embodiments in which electrically conductive support 502 is a leadframe, interconnect structures 506 may be referred to as leadframe leads. The distance between major surface 506A and major surface 506B may be referred to as the thickness of leadframe lead 506. Electrically conductive support 502 is partially embedded in a mold compound 510, which mold compound 510 has major surfaces 510A and 510B and minor surfaces 510C. Support structures 506 are embedded within mold compound 510 such that surfaces 506A of support structure 506 are planar with surface 510A of mold compound 510 and surfaces 506C of support structure 506 are planar with surface 510C of mold compound 510. Because surfaces 506A are exposed and planar with surface 510A and surfaces 506C are exposed and planar with corresponding surfaces 510C, electrically conductive support 502 may be considered as being partially embedded within mold compound 510.

FIG. 39 further illustrates a semiconductor chip or die 312 mounted to support structures 506. More particularly, a die attach material 314 is deposited on a surface of a semiconductor chip 312 and semiconductor chip 312 mounted to interconnect structures 506.

It should be understood that semiconductor component 500 is a single component that has been singulated from a molded leadframe strip (similar to that described with reference to FIG. 20, but without die attach paddles) using a sawing technique.

Figure 40:
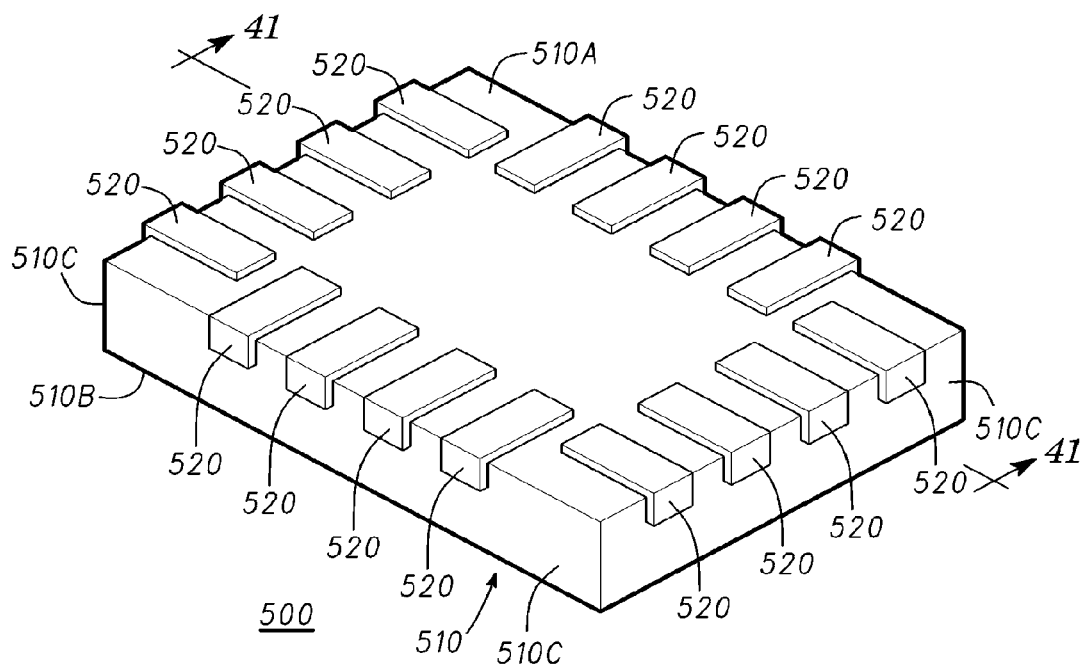
FIG. 40 is an isometric view the semiconductor component of FIG. 38 at a later stage of manufacture.
Figure 41:
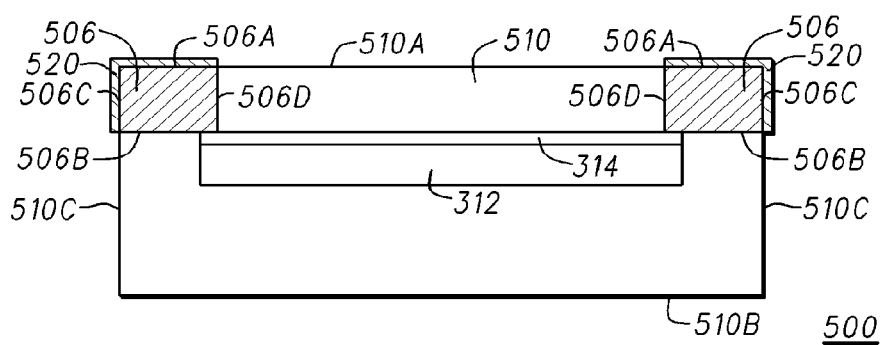
FIG. 41 is a cross-sectional view of the semiconductor component of FIG. 40 taken along section line 41-41 of FIG. 40.

FIG. 40 is an isometric view of semiconductor component 500 shown in FIGS. 38 and 39 at a later stage of manufacture. FIG. 41 is a cross-sectional view of semiconductor component 500 taken along section line 41-41 of FIG. 40. For the sake of clarity, FIGS. 40 and 41 will be described together. A layer of electrically conductive material 520 is formed on the exposed portions of interconnect structures 506, i.e., on surfaces 506A and 506C. Electrically conductive material 520 is not formed on the portions of interconnect structures 506 within or surrounded by mold compound 520. Electrically conductive layers 520 are formed using, for example, an electroplating process such as a spouted bed electroplating process or a vibratory plating process. The spouted bed electroplating process may be performed in a spouted bed electroplating device and the vibratory plating process may be performed in a vibratory plating device. Electrically conductive material 520 may be referred to as a spouted bed electroplated material when formed using a spouted bed electroplating device for its formation or a vibratory plated material when formed using a vibratory plating device for its formation. By way of example, the spouted bed electroplated material or the vibratory plated material may have a thickness at least about 2 micrometers (μm) and may be formed on up to one hundred percent of a surfaces 506A and 506C of least one of the interconnect structures 506. Layers 520 are further illustrated in FIG. 41, which figure shows that after plating, layers 520 on surfaces 506A extend further out of the plane formed by surface 510A and surfaces 506C extend further out of the plane formed by surface 510C.

In implementations, the material of electrically conductive layer 520 is tin. The material of electrically conductive layer 520 may include, by non-limiting example, lead; solder; a combination of tin and lead; silver; nickel; a combination of nickel, lead, and gold; or the like. Similarly, the method for forming electrically conductive layer 520 may be any disclosed in this document. Layer of electrically conductive material 520 may cover or partially cover surfaces 506A and 506C. An advantage of forming layer of electrically conductive material 520 is that it may form a wettable material over edges or surface 506A and 506C that is useful in mounting the semiconductor component in end user applications.

Figure 42:
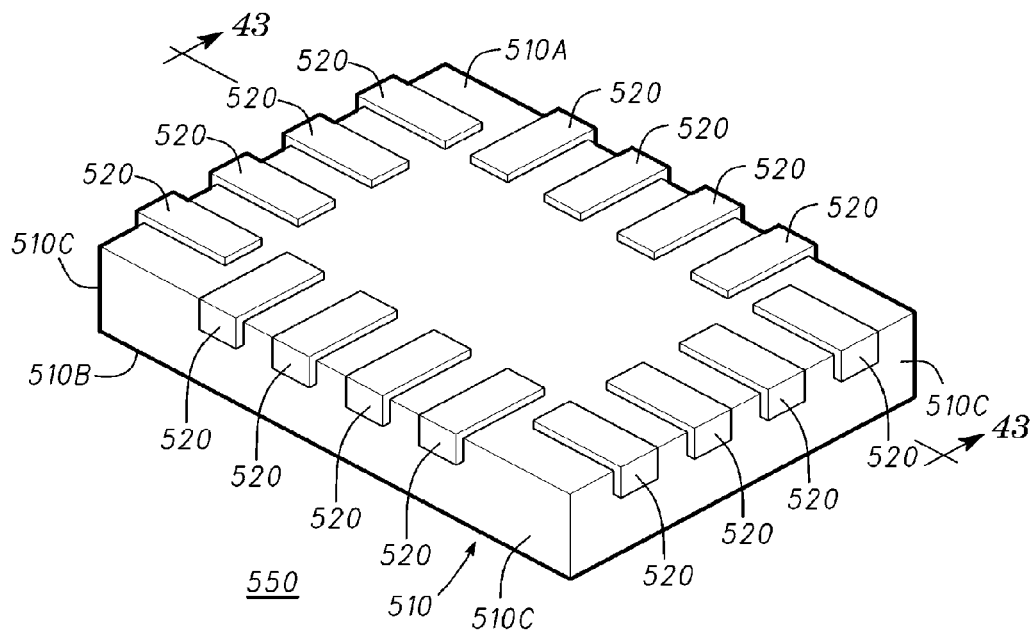
FIG. 42 is an isometric view of another implementation of a semiconductor component during manufacture.
Figure 43:
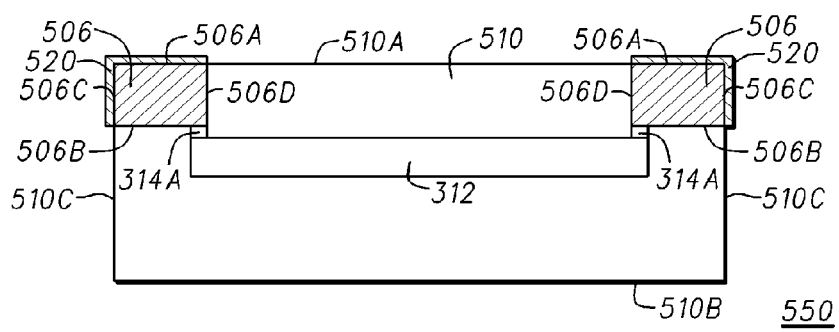
FIG. 43 is a cross-sectional view of the semiconductor component of FIG. 42 taken along section line 43-43 of FIG. 42.

FIG. 42 is an isometric view of another implementation of a semiconductor component 550 during manufacture in accordance with another embodiment of the present invention. FIG. 43 is a cross-sectional view of semiconductor component 550 taken along section line 43-43 of FIG. 42. For the sake of clarity, FIGS. 42 and 43 will be described together. FIGS. 42 and 43 are similar to FIGS. 40 and 41, respectively, except that semiconductor die 312 is mounted to electrical interconnects 506 using a flip-chip technique. Thus, bond pads 315 that are formed on a surface of semiconductor die 312 are mounted to corresponding electrical interconnects 506 using die attach material 314A. Externally, semiconductor component 550 looks the same as semiconductor component 500.

In various implementations the electrically conductive support structure may be a flagless structure.

Figure 44A:
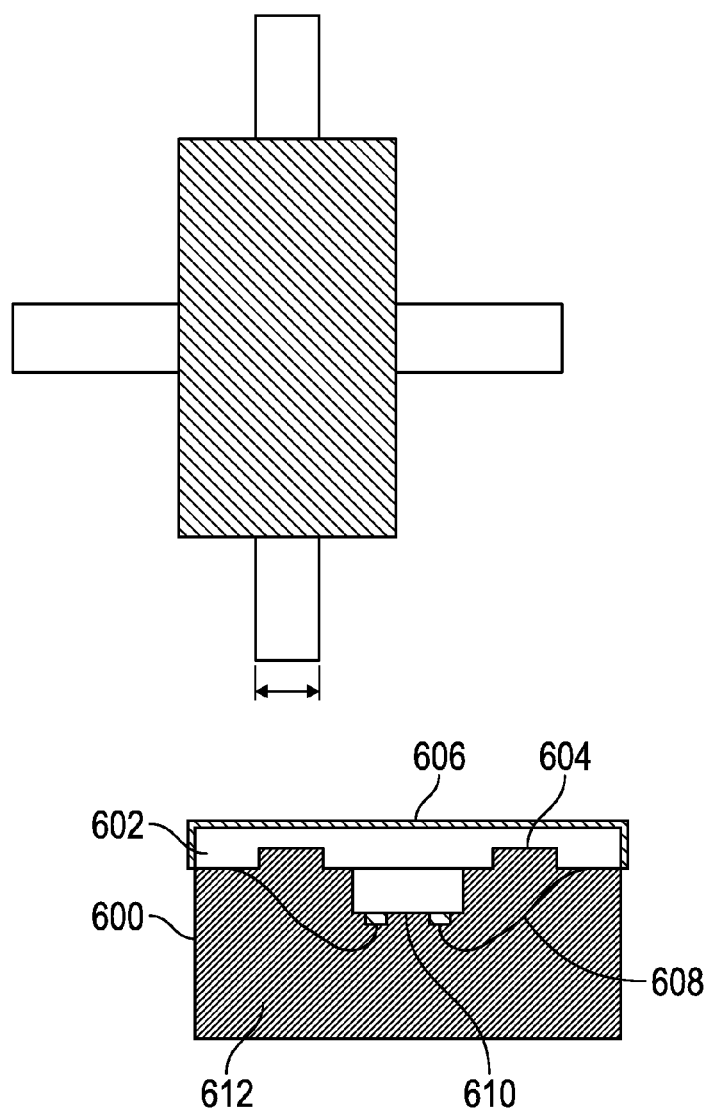
FIG. 44A is a cross-sectional view of another implementation of a semiconductor component showing a saw blade.

Referring to FIG. 44A, an implementation of an encapsulated leadframe 600 is illustrated. The leadframe 600, like those disclosed in this document, contains leadframe leads (leads) 602 and a leadframe flag (flag) to which a die 610 (or any other electrical component disclosed herein) is coupled. Electrical connectors 608 electrically connect the die 610 to the leads 602. Mold compound 612 (which may be any disclosed herein) encapsulates the die 610 and the leadframe except for the leads 602 and the flag. Tie bars 604 couple the leads 602 to the flag. As illustrated, the tie bars 604 are half etched, i.e., the thickness of the tie bars 604 has been etched/sawn partially through prior to be partially encapsulated in the mold compound 612. The exposed surface of the leads 602, the tie bars 604, and the flag have been coated with an electrically conductive layer 606 which coating may include any material disclosed herein, and be performed using any technique disclosed herein.

Following coating of the leads 602, tie bars 604, and the flag with the electrically conductive layer 606, the tie bars 604 are fully electrically and physically singulated. As the diagram of the saw blade above FIG. 44A indicates, the width of the tie bar between the leads 602 and the flag may be sized to match or substantially correspond with the width of the saw blade. While a saw blade is illustrated, the singulation in various implementations can be performed using, by non-limiting example, laser scribing, high pressure water jet cutting, masking and etching processes, and other techniques for cutting the metal and surrounding mold compound including any disclosed in this document.

Figure 44B:
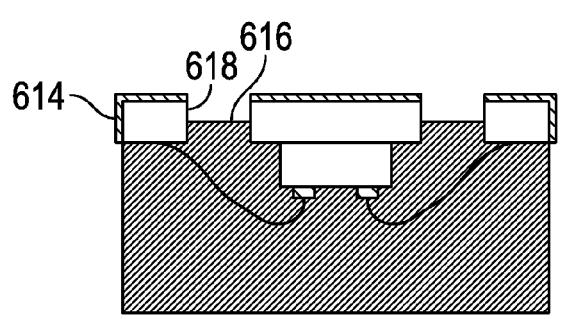
FIG. 44B is a cross-sectional view of the implementation of FIG. 44A following sawing.

FIG. 44B illustrates the leadframe of FIG. 44A following the singulation process. As can be seen, the material from the electrically conductive layer fully extends along the end 614 of the lead 602. This behavior may be referred to as creating a "wettable flank" for the lead, as it permits a solder fillet to be placed on the lead end side of the semiconductor package when the package is mounted. Having the electrically conductive material extend fully along the end may also be referred to as 100% coverage of the ends, which may be desirable in specific industries, such as automotive applications. Because the leads may need to be connected to the leadframe during electroplating (if electroplating is used to coat the leads 602 with the electrically conductive layer), the tie bars 604 are used to establish an electrical connection during the process and then are removed by being singulated.

Referring to FIG. 45A, a top view of a leadframe 620 encapsulated with mold compound 626 is illustrated showing leads 622 and tie bars 628, 630 that couple the leads with the flag 624. FIG. 45B shows a cross-section of the leadframe 620 taken along sectional line A-A. Here, the tie bar 630 is a full thickness tie bar. FIG. 45C shows the structure of the lead frame after the tie bars 630 have been removed leaving gap 632 between the flag 624 and the leads 622. FIG. 46A illustrates the top view of the leadframe 620 following singulation of the tie bars using any of the methods disclosed herein. FIG. 46B shows a similar cross-section view of a tie bar 634 that is half etched. As can be seen, the gap in the tie bar 634 is oriented toward the mold compound and the mold compound fills the gap. In other implementations, however, like those disclosed herein, the gap in the tie bar 634 may be oriented away from the mold compound. FIG. 46C shows the leadframe of FIG. 46B following singulation using any of the methods disclosed herein. From the top view, provided the pattern of the leadframe leads and flag is the same, the half etched version of the leadframe will look the same as the full thickness version following singulation of the tie bars.

Figure 47:
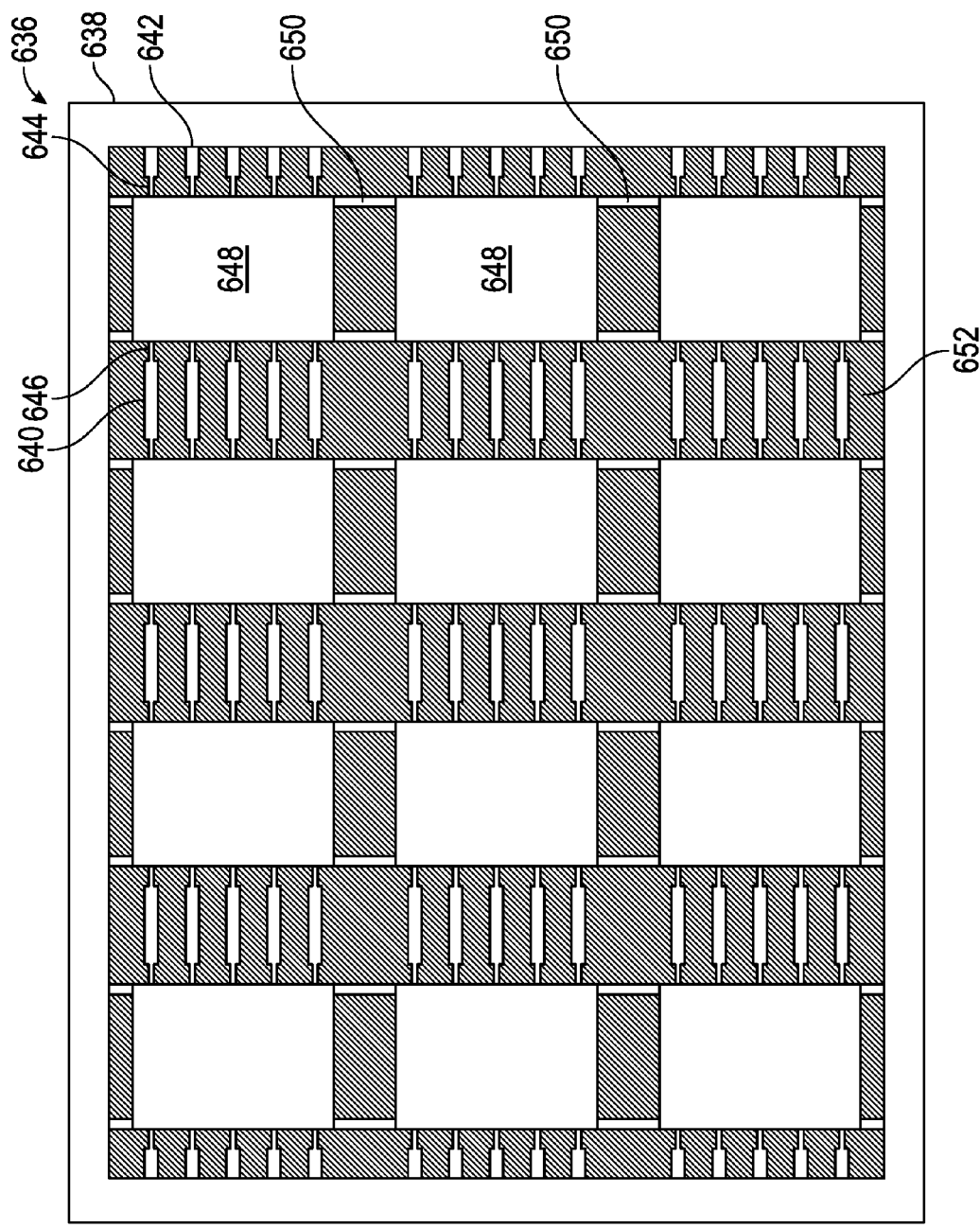
FIG. 47 is a top view of an implementation of a leadframe following encapsulation.

Referring to FIG. 47, an implementation of a leadframe 636 is illustrated. This leadframe 636 contains multiple leadframes for multiple semiconductor packages and has been processed through the steps of coupling a semiconductor die and/or an electronic component to the leadframe and encapsulating with mold compound 652. While the leadframe in FIG. 47 has multiple flags 648, in others, there may be no flags or only some flags. As can be seen, the leads 640 of the leadframe 636 are coupled together (except for those at the edges 638 of the frame) and are coupled to the flag 648 through tie bars 646. Half etched portions 650 may be present between adjacent die flags 648 in various implementations.

Figure 48:
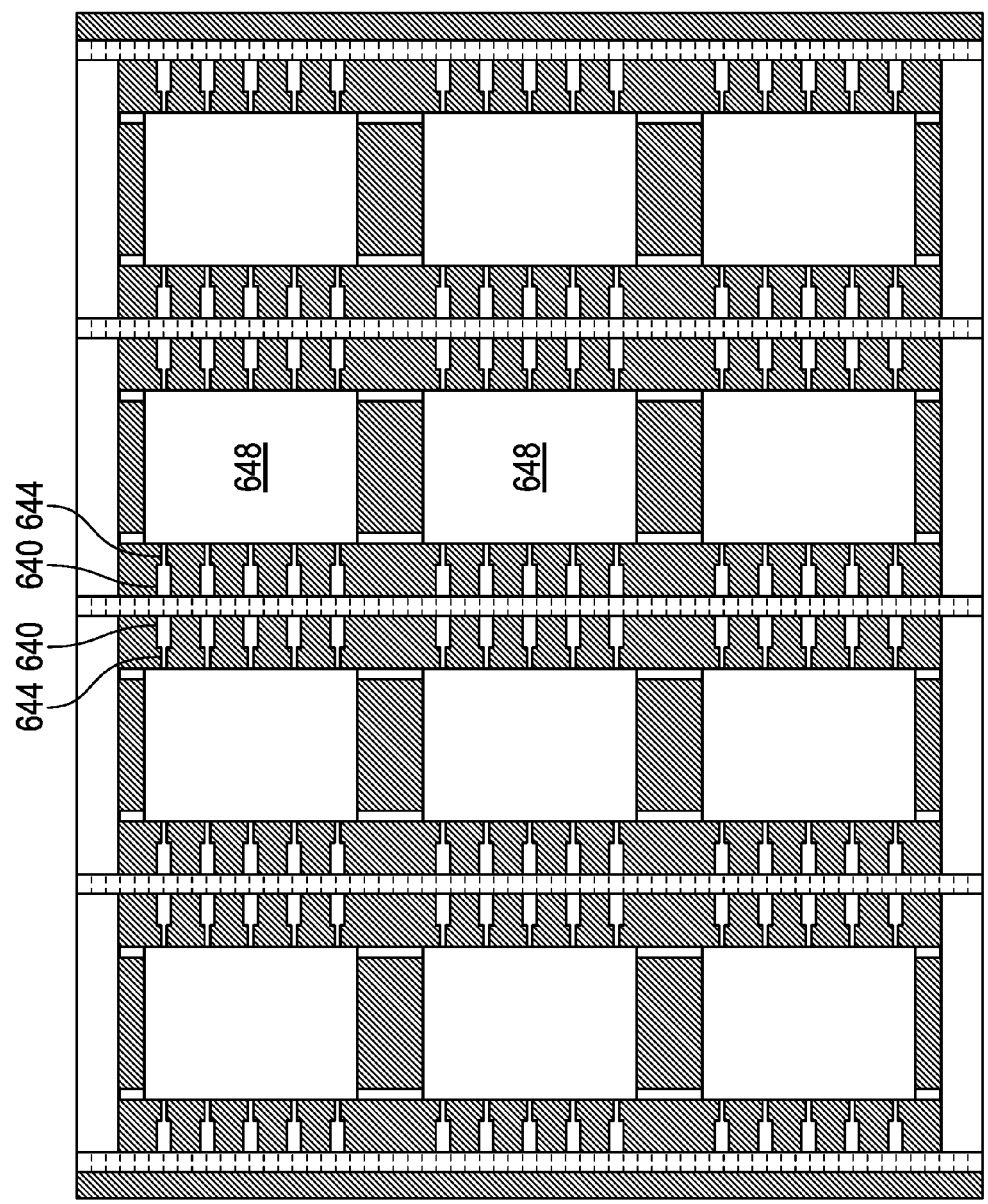
FIG. 48 is a top view of the implementation of a leadframe of FIG. 47 following singulation of the leads of the leadframe.

Referring to FIG. 48, the leadframe implementation of FIG. 47 is illustrated following fully electrically and physically singulating the leads 640 of the leadframe that are joined together in the columns of the leadframe. At this point, the electrical connection to the lead 640 is through the tie bars 644 and the respective die flag 648 to which the leads 640 are coupled. This singulation may be done using any of the singulation processes disclosed in this document.

Figure 49:
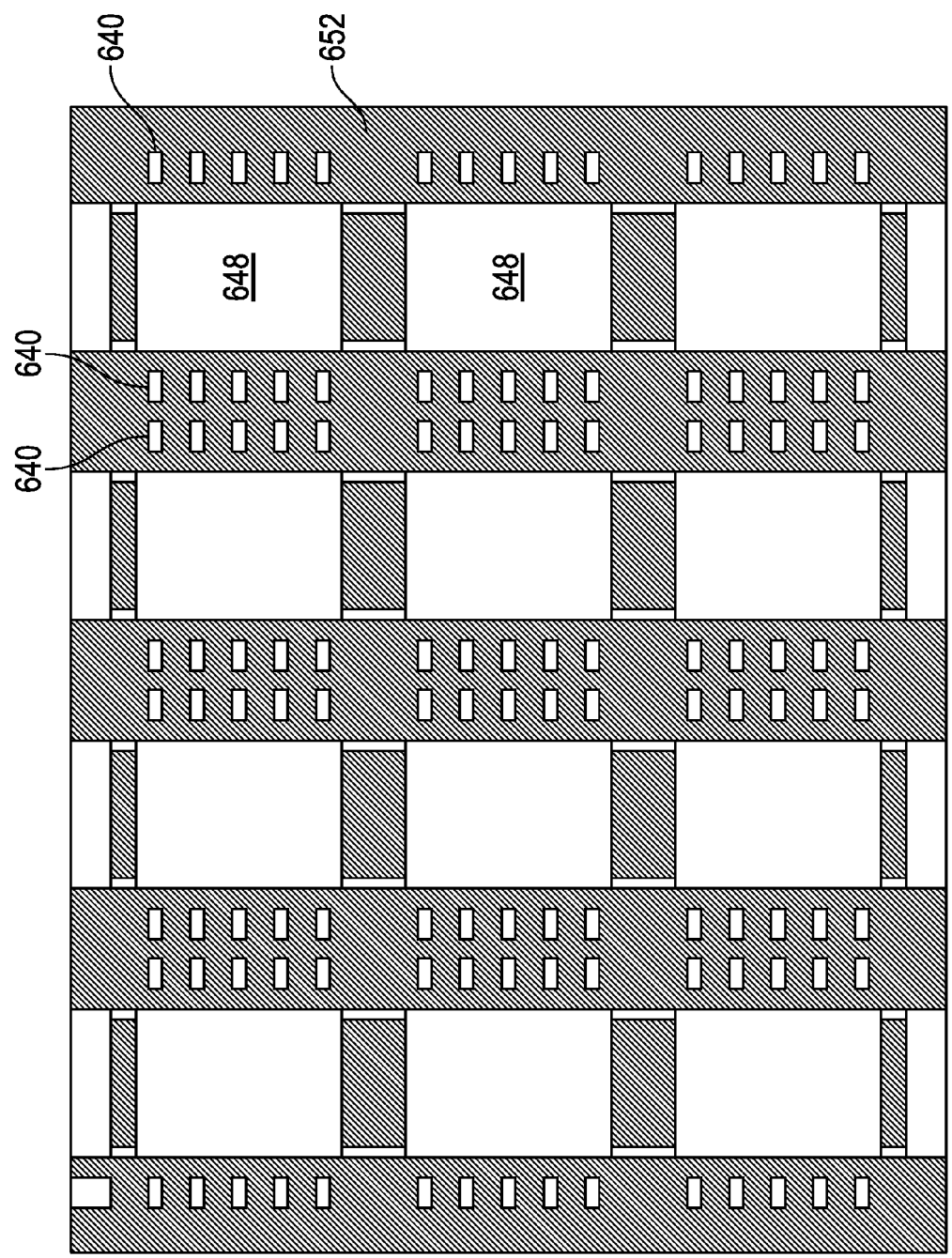
FIG. 49 is a top view of the implementation of the leadframe of FIG. 48 following singulation of the tie bars of the leadframe between the leads and the leadframe flags.
Figure 50:
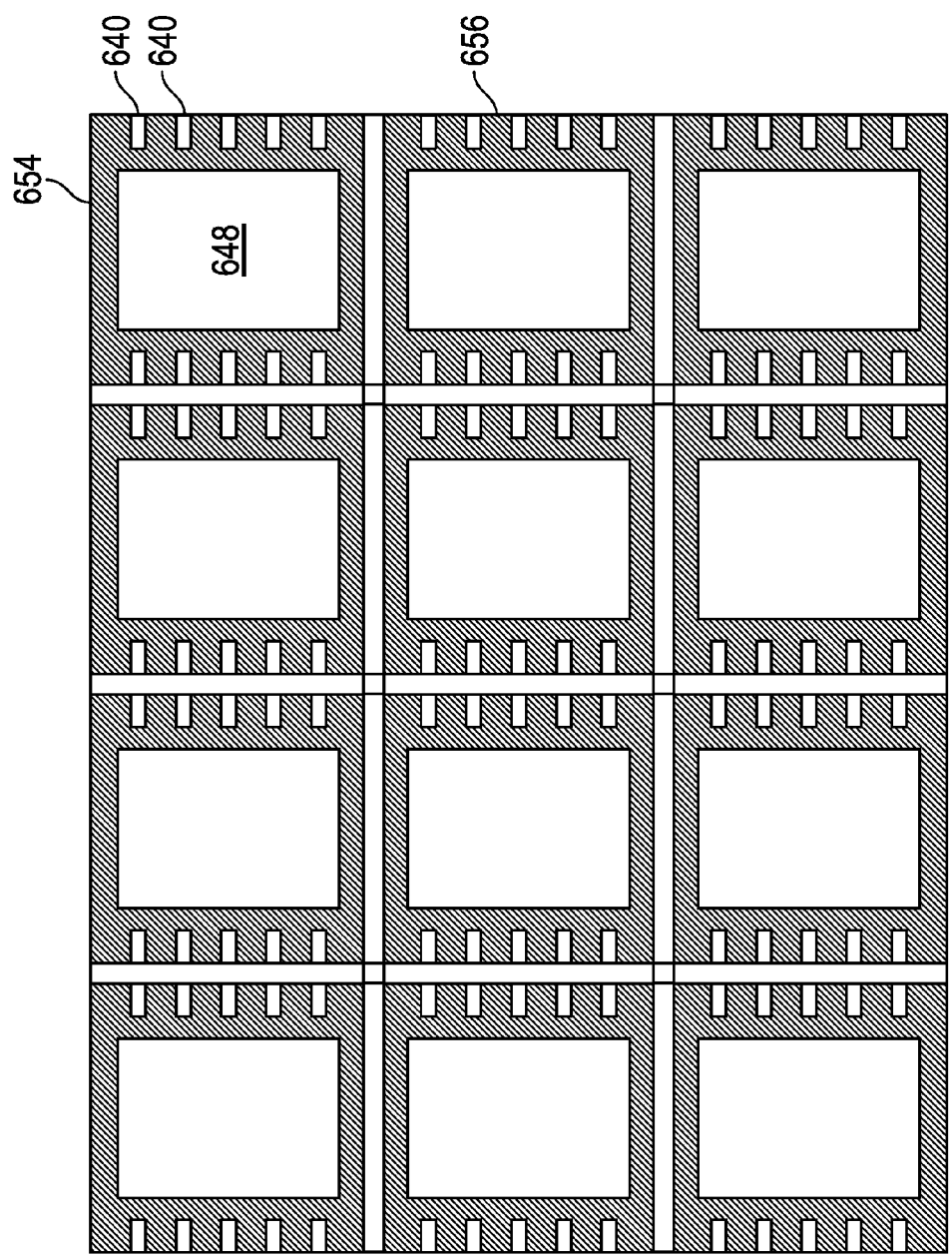
FIG. 50 is a top view of the implementation of the leadframe of FIG. 49 following singulation of the leadframe to form a plurality of semiconductor packages.

Referring to FIG. 49, the leadframe of FIG. 47 is illustrated following coating of the leads 640 (and tie bars 644 and flag 648) with an electrically conductive layer (material) and then fully electrically and physically singulating the tie bars 644 between the leads 640 of the leadframe and the leadframe flag 648. This electrically conductive material may be any disclosed herein. At this point, the mold compound 652 is exposed between the leads 640 and the flags 648. FIG. 50 illustrates the leadframe when the individual packages in the leadframe have been singulated from each other to form semiconductor packages and the edges of the leadframe has been removed as well. Each of the packages 654, 656 has its own set of leads 640 electrically coupled to the flag 648 via connectors within the packages like those disclosed herein.

Figure 51A:
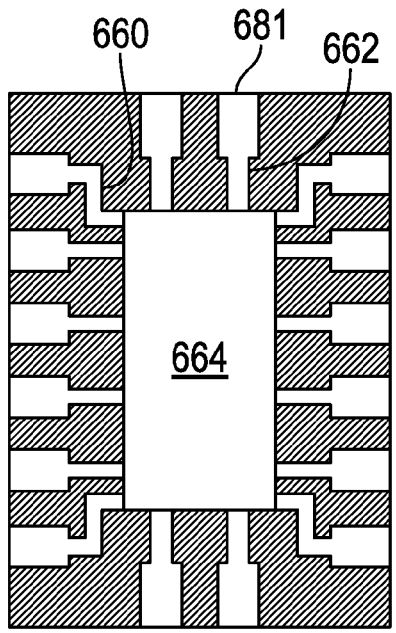
FIGS. 51A and 51B illustrate implementations of leadframes with tie bars that cannot be singulated using saw or high pressure water jet processes.
Figure 51B:
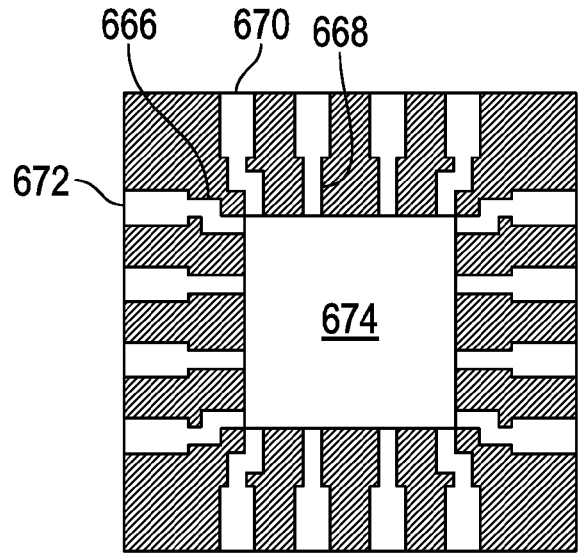
Figure 52:
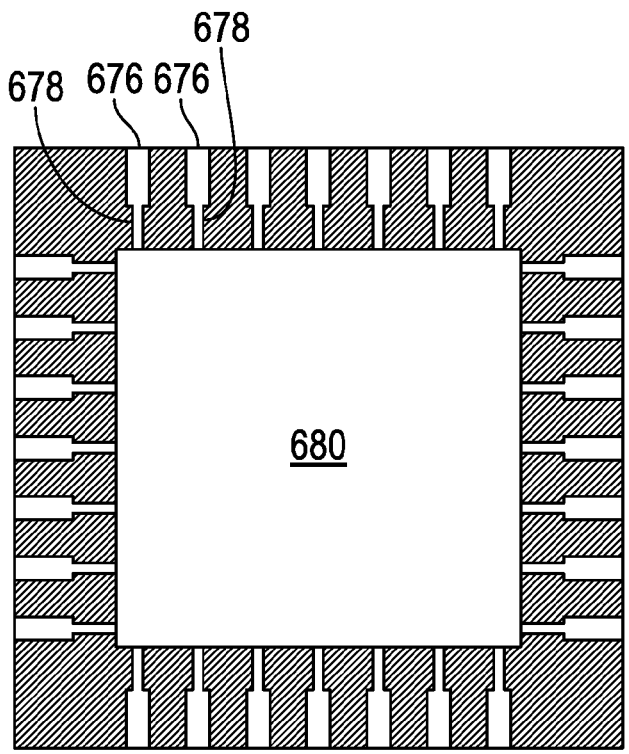
FIG. 52 is a top view of an implementation of a leadframe that can be singulation using a saw or high pressure water jet process.
Figure 53A:
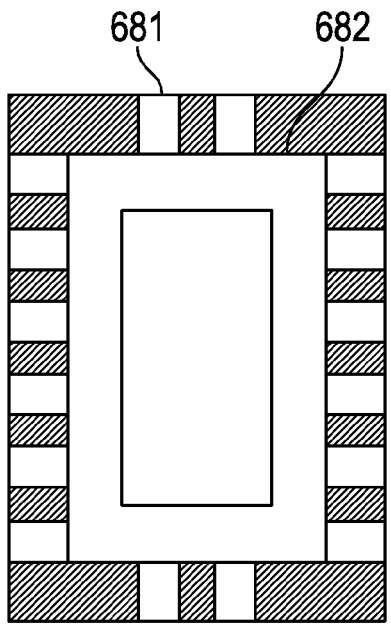
FIGS. 53A and 53B show the leadframes of FIGS. 51A and 51B following singulation using a laser scribe or mask and etch process.
Figure 53B:
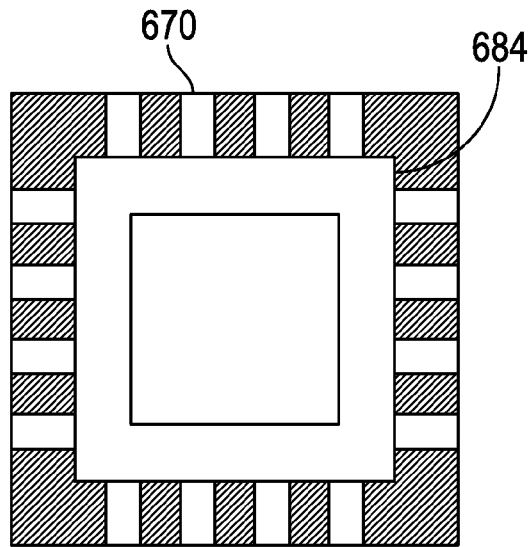
Figure 54:
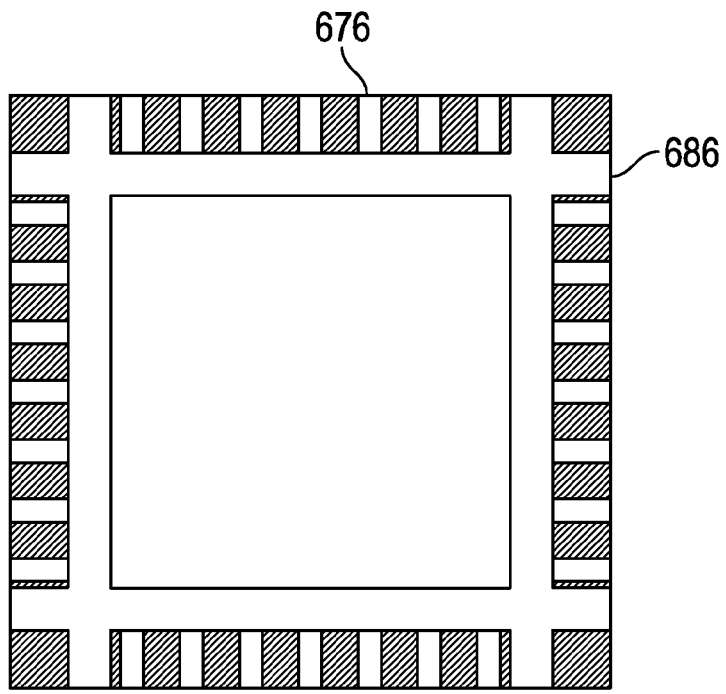
FIG. 54 is a top view of the implementation of FIG. 52 following singulation of the tie bars using a saw or high pressure water jet process.

Referring to FIGS. 51A and 51B, two different leadframe designs are illustrated. In both designs, however, the leads 681, 670 are arranged around the flags 664, 674 in such a way that the tie bars 660, 666 cannot be singulated using a straight line across the leadframes in both X and Y directions without cutting through some of the leads 681, 670. In contrast, the leadframe design illustrated in FIG. 52 is designed so that the tie bars 678 can be cut straight through in the X and Y directions without cutting through the leads 676. FIG. 53A illustrates the leadframe implementation of FIG. 51A with the tie bars removed as indicated by rectangle 682 and FIG. 53B shows a similar rectangle 684. The removal area allows the pads 681 and 670 to be electrically isolated from the flag regions. For these implementations, the removal is done using a technique that can be applied to each individual leadframe or group of leadframes at a time, such as laser scribing, masking and etching, and the like. FIG. 54 shows the rectangular pattern 686 on the leadframe of FIG. 52. This figure shows how the configuration of FIG. 52 can be singulated using all of sawing, high pressure water jet cutting, laser scribing, and other techniques that use clear X and Y direction paths for cutting the tie bars from the leads 676.

Figure 55A:
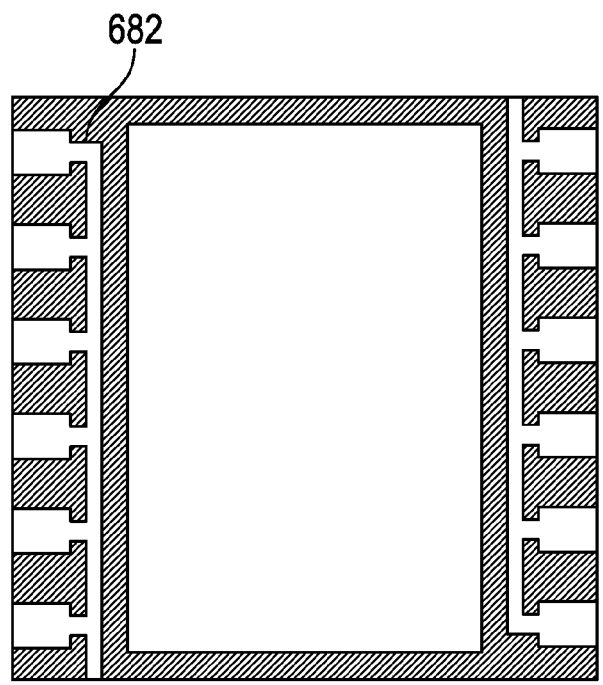
FIGS. 55A and 55B are top views of implementations of leadframes which contain tie bars that are all a predetermined width.
Figure 55B:
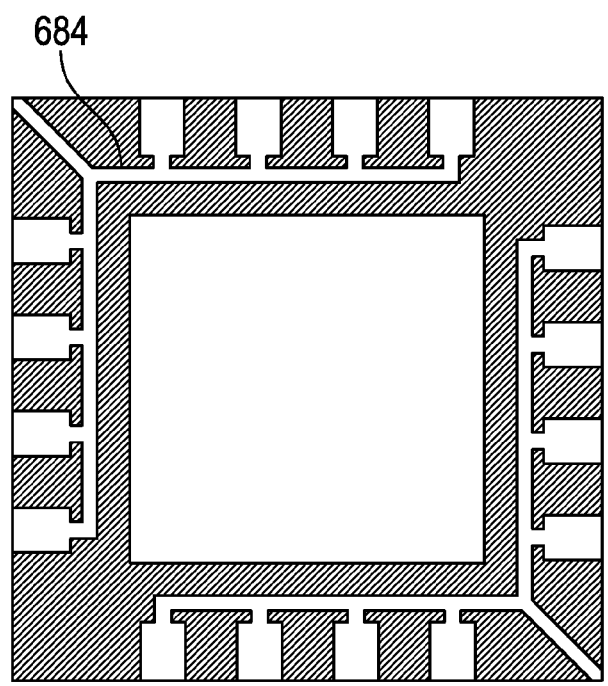

Referring to FIGS. 55A and 55B, two different encapsulated leadframe designs are illustrated showing tie bars 682 that link individual leads together, but which do not couple the leads to the flag of the leadframe. In these implementations, the electrical connection needed for coating with an electrically conductive material is formed not through coupling with the flag but through other structures coupled to the leads/tiebars 682 themselves (assuming the method of coating requires electrical current). In these two leadframes, the distance between the leads and the tie bars 682, 684 is a single predetermined width. In various implementations, because the tie bars 682, 684 all fall within the predetermined width, one single width cut can be used to simultaneously singulate all the tie bars of the leadframe. This may simplify processing and improve run rates.

Figure 59:
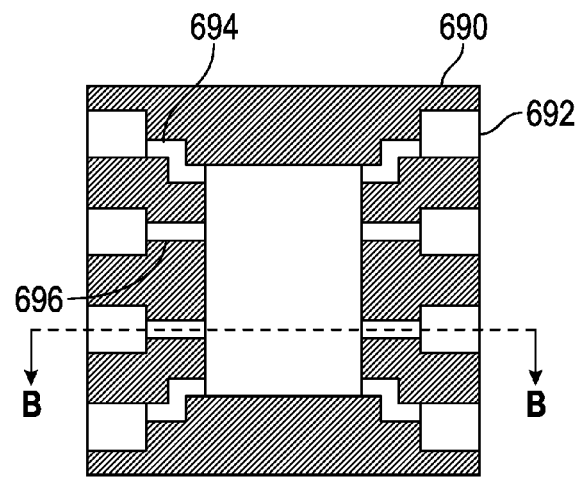
FIG. 59 is a top view of a leadframe implementation with tie bars that have been partially singulated.
Figure 60A:
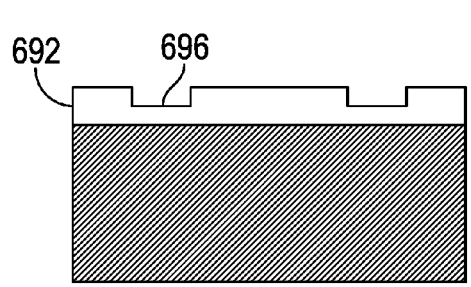
FIG. 60A is a cross-sectional view of a leadframe taken along sectional line B-B in FIG. 59 either post partial singulation or half etched.
Figure 60B:
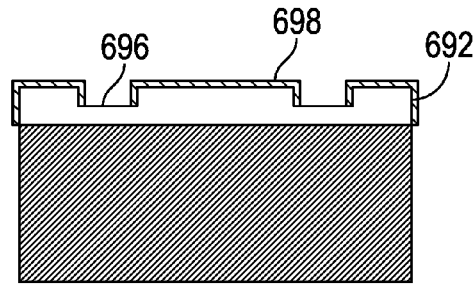
FIG. 60B is a cross-sectional view of the leadframe of FIG. 60A following coating the leads with an electrically conductive layer.
Figure 61:
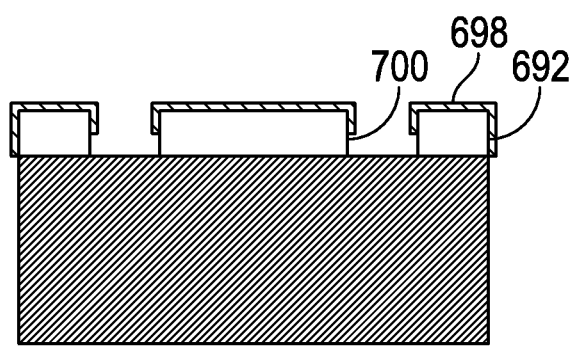
FIG. 61 is a cross-sectional view of the leadframe of FIG. 60B following full singulation of the tie bars.

Referring to FIG. 59, 60A, and as discussed previously, the tie bars 696 may be half etched and face away from the mold compound, or they may be partially physically singulated before the leads 692 and tie bars 696 are coated with the electrical conductive material 698 (see FIG. 60B). The singulation of the tie bars 696 may take place using any singulation process disclosed in this document. Following coating, full singulation of the tie bars 696 takes place, and, as can be seen in FIG. 61, the resulting structure has a full coating of electrically conductive material on the end (flank) of the leads 692 and a partial coating on either side of the trench 700 where the partially singulated or half etched tie bars 696 had been. In various implementations, having the electrically conductive material down in the trench 700 as well as on the flank end of the leads 692 may further assist with improving wettability and adhesion during the packaging bonding process.

Figure 56:
FIG. 56 is a side view of a leadframe that has been encapsulated.
Figure 57:
FIG. 57 is a side view of a leadframe with leads on two edges bent downwardly via deflection.
Figure 58:
FIG. 58 is a side view of a leadframe with leads on two edges bend downwardly via a formed bending process.

Referring to FIG. 56, a side view of an implementation of an encapsulated leadframe 686 is illustrated. The leadframe 686 has an edge 688 which is electrically conductive and can be used during an electrodeposition process to apply electrically conductive material to the leadframe. In various processing operations, including those disclosed herein that involve singulation and partial singulation of various components, including tie bars, the edge of the leadframe may also be cut or singulated, which may reduce/hamper or eliminate the ability of the edge to properly serve as an electrical conductor. Accordingly, referring to FIG. 57, the edge 688 is shown after having been deflected toward the encapsulation material thus placing it out of the location where it can be singulated. One or more edges may be bent through deflection, and the deflection can take place toward or away from the encapsulation material in various implementations. FIG. 58 illustrates how the edge 688 of the leadframe 686 may be bent through a formed bending operation to form a stepped bend in the edge 688. In this way, the outside edge of the edge 688 is further placed out of the path of a singulation tool (such as a saw, for example). A wide variety of possibilities and combination of bends made by deflection, formed bending, etc. may be used by those of ordinary skill using the principles disclosed herein. In various implementations, the bending of the edge 688 takes place prior to fully and electrically singulating the one or more tie bars. In other implementations, the bending could take place before other singulation operations, including partial singulation, however.

In places where the description above refers to particular implementations of semiconductor packages and related methods and implementing components, sub-components, methods and sub-methods, it should be readily apparent that a number of modifications may be made without departing from the spirit thereof and that these implementations, implementing components, sub-components, methods and sub-methods may be applied to other semiconductor packages and related methods.

What is claimed is:

1. A method of forming a semiconductor package comprising:
    providing a lead frame;
    coupling one of a semiconductor die and an electronic component to the lead frame;
    encapsulating at least a portion of the one of the semiconductor die and the electronic component using a mold compound;
    forming a trench through two or more leads of the lead frame and extending to the molding compound which exposes a complete side surface of the two or more leads of the lead frame;
    coating the two or more leads of the lead frame including the complete side surface within the trench with an electrically conductive layer;
    fully electrically and physically singulating one or more tie bars between one of:
        two or more leads of the lead frame;
        a lead of the two or more leads and a lead frame flag; and
        any combination thereof; and
    bending one or more edges of the lead frame prior to fully electrically and physically singulating the one or more tie bars.

2. The method of claim 1, further comprising singulating the lead frame to form one or more semiconductor packages.

3. The method of claim 1, further comprising partially physically singulating the one or more tie bars between one of:
    the two or more leads of the lead frame;
    the lead of the two or more leads and the lead frame flag; and
    any combination thereof;

prior to coating the two or more leads of the lead frame with the electrically conductive layer.

4. The method of claim 1, wherein bending one or more edges of the lead frame further comprises one of deflecting the one or more edges of the lead frame to form a simple bend and formed bending the one or more edges of the lead frame to form a stepped bend.

5. The method of claim 1, wherein the lead frame comprises one or more half etched portions.

6. The method of claim 1, further including forming a bond wire between a first lead and a second lead of the one or more leads of the leadframe.

7. The method of claim 6, wherein fully electrically and physically singulating one or more tie bars further comprises singulating using one of a laser cutting process and a masking and etching cutting process.

8. The method of claim 1, wherein a distance between the one or more leads of the lead frame and the one or more tie bars is a single predetermined width.

9. A method of processing an encapsulated lead frame comprising:
   providing a encapsulated lead frame;
   forming a trench completely through two or more leads of the encapsulated lead frame to expose a side surface of the two or more leads of the lead frame;
   coating the two or more leads of an encapsulated lead frame including the side surface within the trench with an electrically conductive layer;
   fully electrically and physically singulating one or more tie bars between one of:
     two or more leads of the encapsulated lead frame;
     a lead of the two or more leads and a lead frame flag; and
     any combination thereof; and
   bending one or more edges of the encapsulated lead frame prior to fully electrically and physically singulating the one or more tie bars.

10. The method of claim 9, further comprising singulating the encapsulated lead frame to form one or more semiconductor packages.

11. The method of claim 9, further comprising partially physically singulating the one or more tie bars between one of:
   the two or more leads of the encapsulated lead frame;
   the lead of the two or more leads and the lead frame flag; and
   any combination thereof;
   prior to coating the two or more leads of the encapsulated lead frame with the electrically conductive layer.

12. The method of claim 9, wherein bending one or more edges of the encapsulated lead frame further comprises one of deflecting the one or more edges of the encapsulated lead frame to form a simple bend and formed bending the one or more edges of the encapsulated lead frame to form a stepped bend.

13. The method of claim 9, wherein the encapsulated lead frame comprises one or more half etched portions.

14. The method of claim 9, wherein fully electrically and physically singulating one or more tie bars further comprises singulating using one of a laser cutting process and a masking and etching cutting process.

15. The method of claim 9, wherein a distance between the one or more leads of the encapsulated lead frame and the one or more tie bars is a single predetermined width.

* * * * *